(12) United States Patent
Khwa et al.

(10) Patent No.: US 11,581,039 B2
(45) Date of Patent: Feb. 14, 2023

(54) METHODS OF CONTROLLING PCRAM DEVICES IN SINGLE-LEVEL-CELL (SLC) AND MULTI-LEVEL-CELL (MLC) MODES AND A CONTROLLER FOR PERFORMING THE SAME METHODS

(71) Applicant: Taiwan Semiconductor Manufacturing Company Limited, Hsinchu (TW)

(72) Inventors: Win-San Khwa, Hsinchu (TW); Kerem Akarvardar, Hsinchu (TW); Yu-Sheng Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 149 days.

(21) Appl. No.: 17/151,538

(22) Filed: Jan. 18, 2021

(65) Prior Publication Data
US 2022/0230681 A1 Jul. 21, 2022

(51) Int. Cl.
*G11C 11/00* (2006.01)
*G11C 13/00* (2006.01)

(52) U.S. Cl.
CPC ........ *G11C 13/0004* (2013.01); *G11C 13/004* (2013.01); *G11C 13/0061* (2013.01); *G11C 13/0064* (2013.01); *G11C 13/0069* (2013.01); *G11C 2013/0083* (2013.01)

(58) Field of Classification Search
CPC .............. G11C 13/0004; G11C 13/004; G11C 13/0061; G11C 13/0064
USPC ......................................................... 365/148
See application file for complete search history.

(56) References Cited

U.S. PATENT DOCUMENTS

| | | | |
|---|---|---|---|
| 2011/0272660 A1* | 11/2011 | Wells | H01L 45/06 257/E45.001 |
| 2014/0098593 A1* | 4/2014 | Calderoni | G11C 13/004 365/163 |

\* cited by examiner

*Primary Examiner* — Vu A Le
(74) *Attorney, Agent, or Firm* — The Marbury Law Group, PLLC

(57) ABSTRACT

Various embodiments provide methods for configuring a phase-change random-access memory (PCRAM) structures, such as PCRAM operating in a single-level-cell (SLC) mode or a multi-level-cell (MLC) mode. Various embodiments may support a PCRAM structure being operating in a SLC mode for lower power and a MLC mode for lower variability. Various embodiments may support a PCRAM structure being operating in a SLC mode or a MLC mode based at least in part on an error tolerance for a neural network layer.

20 Claims, 18 Drawing Sheets

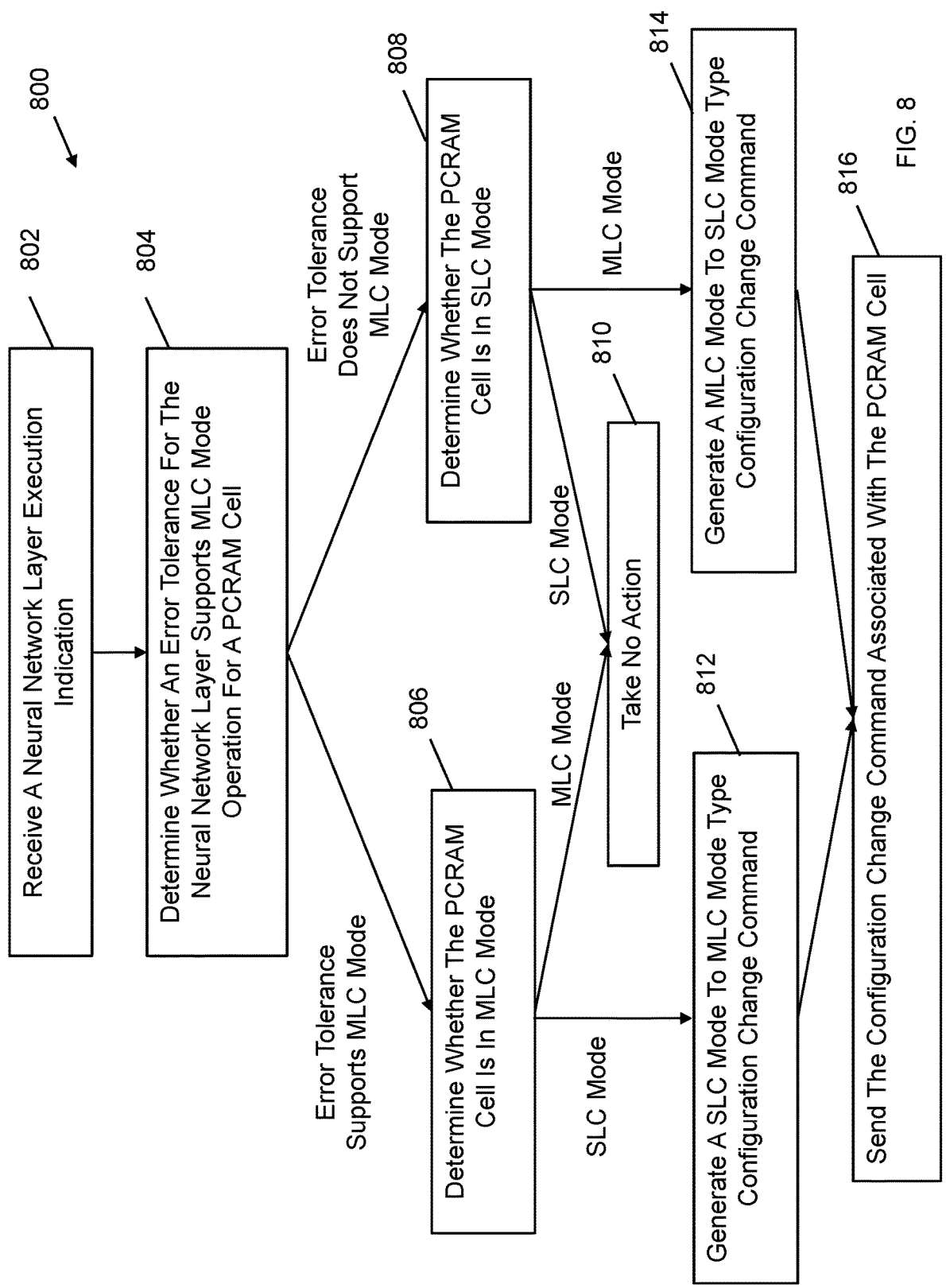

METHODS OF CONTROLLING PCRAM DEVICES IN SINGLE-LEVEL-CELL (SLC) AND MULTI-LEVEL-CELL (MLC) MODES AND A CONTROLLER FOR PERFORMING THE SAME METHODS

BACKGROUND

A phase-change random-access memory (PCM or PCRAM) is a form of non-volatile random-access computer memory. PCRAM technology is based upon a material that can be either amorphous or crystalline at normal ambient temperatures. During conditions in which the material is in the amorphous state, the material has a high electrical resistance. The amorphous state can be referred to as a high resistance state (HRS). During conditions in which the material is in the crystalline state, the material has a low electrical resistance. The crystalline state can be referred to as a low resistance state (LRS).

In order to control the state of the material, the material may be heated and cooled. By heating the material above its crystallization point, the material enters its crystalline state. The material may be heated, for example, by passing current through a heating element. As the material cools, it enters an amorphous state. The change of phase in a PCRAM cell and the resulting change in electrical resistance can be used to store data in the PCRAM cell.

To change the phase of the PCRAM cell, a SET operation switches the material of the PCRAM cell to the crystalline phase and a RESET operation switches the material of the PCRAM into the amorphous phase. The SET operation crystallizes the material of the PCRAM by heating it above its crystallization temperature, and the RESET operation melt-quenches the material of the PCRAM to make the material amorphous. The SET operation and the RESET operation can be associated with different electrical current profiles or voltage profiles, such as one type of pulses for the RESET operation that heat the material of the PCRAM above its melting temperature and another type of pulses for the SET operation to heat the material of the PCRAM above its crystallization temperature but below its melting temperature.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a process flow diagram illustrating a method for programming a PCRAM cell, according to various embodiments of the present disclosure.

DETAILED DESCRIPTION

Figure 1:
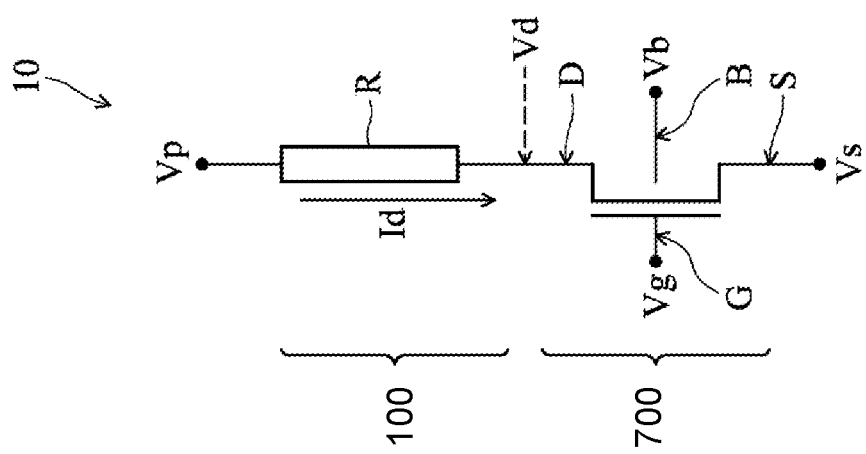
FIG. 1 is a schematic view of a phase-change random-access memory (PCRAM) structure including a phase-change memory cell and a field effect transistor, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ranges can be expressed herein as from "about" one particular value, and/or to "about" another particular value. When such a range is expressed, examples include from the one particular value and/or to the other particular value. Similarly, when values are expressed as approximations, by use of the antecedent "about" or "substantially" it will be understood that the particular value forms another aspect. It will be further understood that the endpoints of each of the ranges are significant both in relation to the other endpoint, and independently of the other endpoint.

The present disclosure is directed to semiconductor devices and operating methods for the same, specifically including methods for controlling a phase-change random-access memory (PCRAM) structure to operate in a single-level-cell (SLC) mode and/or a multi-level cell (MLC) mode. The present disclosure is also related to methods for programming a PCRAM structure, such as a PCRAM structure that is part of artificial intelligence (AI) hardware, to operate in a SLC mode and/or a MLC mode based on aspects of a neural network, such an error tolerance for a neural network layer or other attributes of the neural network.

A phase-change random-access memory (PCRAM) is a non-volatile memory device that leverages different resistive phases and heat induced phase transition between the phases of phase-change materials and resistive materials. Examples of the phase-change materials may be, but are not limited to, chalcogenide materials, such as germanium-antimony-tellurium (GeSbTe or GST) materials (e.g., $Ge_2Sb_2Te_5$, GeTe—$Sb_2Te_3$, etc.), and/or aluminum-antimony materials (e.g., $Al_{50}Sb_{50}$, etc.). Other suitable chalcogenide materials are within the contemplated scope of disclosure. A PCRAM may be composed of many memory cells that operate independently. A PCRAM cell may include a heater and a resistor. The PCRAM cell may operate as a data storage element made mainly of a reversible phase-change material to provide at least two dramatically different resistivities for logical "0" state and "1" state. To read a state (data) from the PCRAM cell, a sufficiently small current is applied to the phase-change material without triggering the heater to generate heat. In this way, the resistivity of the phase-change material may be measured and the states representing the resistivities, i.e., a "0" state for high resistivity or a "1" state for low resistivity can be read.

To write a state (data) in the PCRAM cell, for example, to write a "1" state representing a low resistivity phase of the phase-change material, a medium electric current may be applied to the heater which generates heat for annealing the phase-change material at a temperature above the crystallization temperature but below the melting temperature of the phase-change material for a time period to achieve a crystalline phase. As the phase-change material heats to a temperature above the crystallization temperature, the material may enter a crystalline state where the phase-change material exhibits a low electrical resistance. With the low resistance value, a charge may flow into the material to establish the "1" state value.

To write a "0" state representing a high resistivity phase of the phase-change material, a very large electric current may be applied to the heater to generate heat to melt the phase-change material at a temperature higher than the melting temperature of the phase-change material; and the electric current is abruptly cut off to lower the temperature to below the crystallization temperature of the phase-change material to quench and stabilize the amorphous structure of phase-change material. As the phase change material enters the amorphous state, the phase-change material exhibits a high resistance value. The high resistance value may impede a charge from flowing into the material to establish a "0" state value. The very large electric current can thus be in a pulse form.

PCRAM cells may have the ability to achieve a number of distinct intermediary states, thereby having the ability to hold single bits in a single cell supporting a single-level-cell (SLC) mode or multiple bits in a single cell, such as two bits supporting a multiple-level-cell (MLC) mode. In a SLC mode, the PCRAM may sometimes be referred to as a SLC type memory structure. In a MLC mode, the PCRAM may sometimes be referred to as a MLC type memory structure. In a SLC mode, the PCRAM may fluctuate between a high resistance state (HRS) in response to a RESET operation and a low resistance state (LRS) in response to a SET operation. In a MLC mode, the PCRAM may be controlled to achieve one of multiple intermediate states between the HRS in response to the RESET operation and the LRS in response to the SET operation.

While both a PCRAM cell operating in a SLC mode and a PCRAM cell operating in a MLC mode may be controlled by SET and RESET operations, the current operating mode of the PCRAM cell, such as a SLC mode or MLC mode, may have an impact on different SET program behavior depending on the strength of the preceding RESET operation that occurred. For example, when a RESET state of the PCRAM cell was programmed with a high energy, a subsequent SET transition may exhibit a generally smooth transition, thereby favoring MLC programming. As another example, when a preceding RESET state of the PCRAM cell was programmed with a low energy, the subsequent SET transition may exhibit an abrupt transition, thereby favoring SLC programming. As the strength of the preceding RESET operation that occurred may impact the SLC mode and/or MLC mode operation, a PCRAM cell programming flow that transits between SLC mode and MLC mode without considering the impact of RESET behavior on the PCRAM cell may be a suboptimal programming flow. As an example, when a preceding RESET state of the PCRAM cell was programmed with a high energy, subsequent SLC programming may be more power hungry as compared to a RESET state of the PCRAM cell that was programmed with a low energy. As another example, when a preceding RESET state of the PCRAM cell was programmed with a low energy, subsequent MLC programming may be less controllable as compared to a RESET state of the PCRAM cell that was programmed with a high energy.

FIG. 1 is a schematic view of a PCRAM structure 10 constructed according to an embodiment. The PCRAM structure 10 may include one phase-change memory cell 100 and a current-controlling device 700 connected together. The phase-change memory cell 100 includes a phase-change material layer interposed between two electrodes. In some embodiments, the resistance of the phase-change layer material may be configured to be adjusted into multiple levels that represent different logic states, respectively. In embodiments in which a phase-change layer material is configured to be adjusted into multiple levels that represent different logic states, respectively, the PCRAM structure 10 may be considered to be operating in a multiple-level-cell (MLC) mode. In some embodiments, the resistance of the phase-change layer material may be configured to be adjusted to a single level that represent a single logic state. In scenarios in which a phase-change layer material is configured to be adjusted to a single level that represent a single logic state, the PCRAM structure 10 may be considered to be operating in a single-level-cell (SLC) mode.

The current-controlling device 700 in the PCRAM structure 10 may be a device that is operable to control the current flow through the phase-change memory cell 100 during the operations. In the present embodiment, the current-controlling device 700 is a transistor (or selector transistor), such as a field effect transistor (FET). For example, the FET 700 may be a metal-oxide-semiconductor (MOS) FET. The FET 700 includes source (S), drain (D) and gate (G). The source S and drain D may be designed asymmetrically, such that a voltage drop over the FET during a forming operation and an off-state leakage current may be collectively optimized. The source S and drain D may separately formed, so that the source S and drain D may be independently tuned to achieve the asymmetric structure. More particularly, the source S and drain D may be different from each other in term of doping concentration. In various embodiments, the source and drain may be different in at least one of doping concentration, doping profile and doping species.

The FET 700 may be electrically coupled with the memory cell 100. In an embodiment, one electrode of the memory cell 100 may be connected to the drain D of the FET 700. The gate G of the FET 700 may be connected to a word line, and another electrode of the memory cell 100 may be connected to a bit line, as discussed in detail with regard to FIG. 3.

As illustrated in FIG. 1, the gate (G), source (S), drain (D) and body of the FET 700 are labeled as G, S, D, and B, respectively. The corresponding voltages of the gate, source, drain and substrate during the operations are labeled as Vg, Vs, Vd and Vb, respectively. Furthermore, during operation, the current through the memory cell 100 is labeled as Id, and the voltage applied to one electrode of memory cell 100 from the bit line is labeled as Vp.

In one embodiment, the PCRAM structure 10 may be a two terminal memory structure, with the gate of the FET 700 operating as a first terminal, and one electrode of the memory cell 100 operating as a second terminal. The first terminal is controlled by a first voltage applied to the gate G of FET 700 from the word line, and the second terminal is controlled by a second voltage applied to the one electrode of the phase-change memory cell from the bit line. In one example, the source is grounded, and the body of the FET 700 is grounded or floating.

In another embodiment, the PCRAM structure 10 may be a three terminal memory structure, wherein the three terminals include the gate of FET 700 as a first terminal, the electrode of the memory cell 100 (the electrode that is not directly connected with the drain of the transistor) as a second terminal, and the source of the FET 700 as a third terminal. Particularly, during the operations of the phase-change memory cell 100, the first terminal (gate) may be controlled by a first voltage from the word line, the second terminal may be controlled by a second voltage from the bit line, and the third terminal may be controlled by a third voltage from a source line. In one example, the source is grounded. In an alternative example, the second terminal is grounded. The substrate (or the body) of the FET 700 may be grounded or floating.

Figure 2:
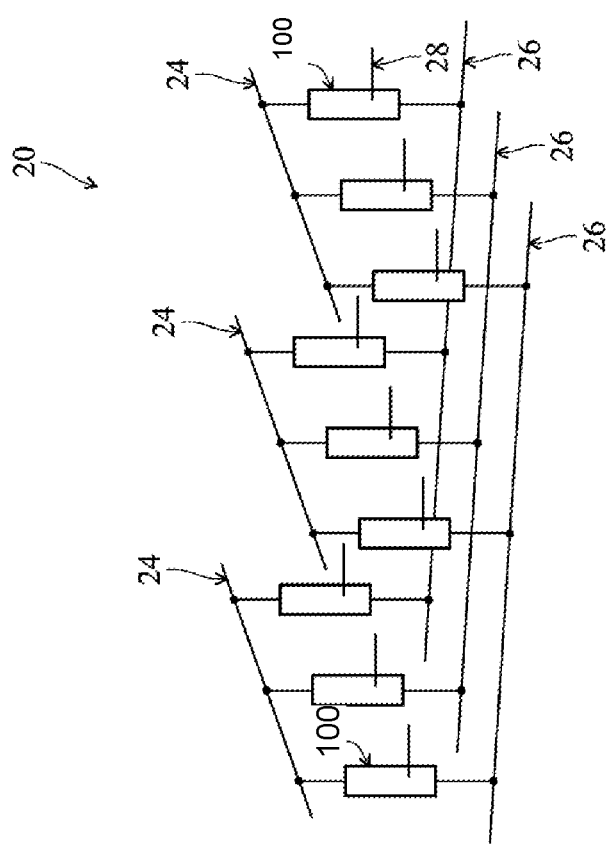
FIG. 2 is a schematic view of a PCRAM structure including multiple phase-change memory cells, according to various embodiments of the present disclosure.

FIG. 2 is a schematic view of a memory structure 20 having a plurality of phase-change memory cells 100 constructed according to various embodiments of the present disclosure. With reference to FIGS. 1-2, the phase-change memory cells 100 may be configured in an array coupled with a plurality of word lines 24 and a plurality of bit lines 26. In one embodiment, the word lines 24 and the bit lines 26 may be cross-configured. Furthermore, each of the phase-change memory cells 100 may be operable to achieve single resistance levels and accordingly single bit storage (e.g., in a SLC mode) and/or multiple resistance levels and accordingly multiple bit storage (e.g., in a MLC mode). In the present embodiment, source lines 28 are configured to connect to the sources of the memory cells 100, respectively. The source lines 28 may be configured such that one source line 28 is coupled with one respective phase-change memory cell 100. Alternatively, one source line may be coupled with a subset of the phase-change memory cells 100 in the memory structure 20. In some embodiments, the memory structure 20 may be configured such that all phase-change memory cells 100 operate in a SLC mode at a given time. In some embodiments, the memory structure 20 may be configured such that all phase-change memory cells 100 operate in a MLC mode at a given time. In some embodiments, the memory structure 20 may be configured to be partitionable such that one or more phase-change memory cells 100 operate in a SLC mode and one or more phase change memory cells 100 operate in a MLC mode at a given time.

Figure 3:
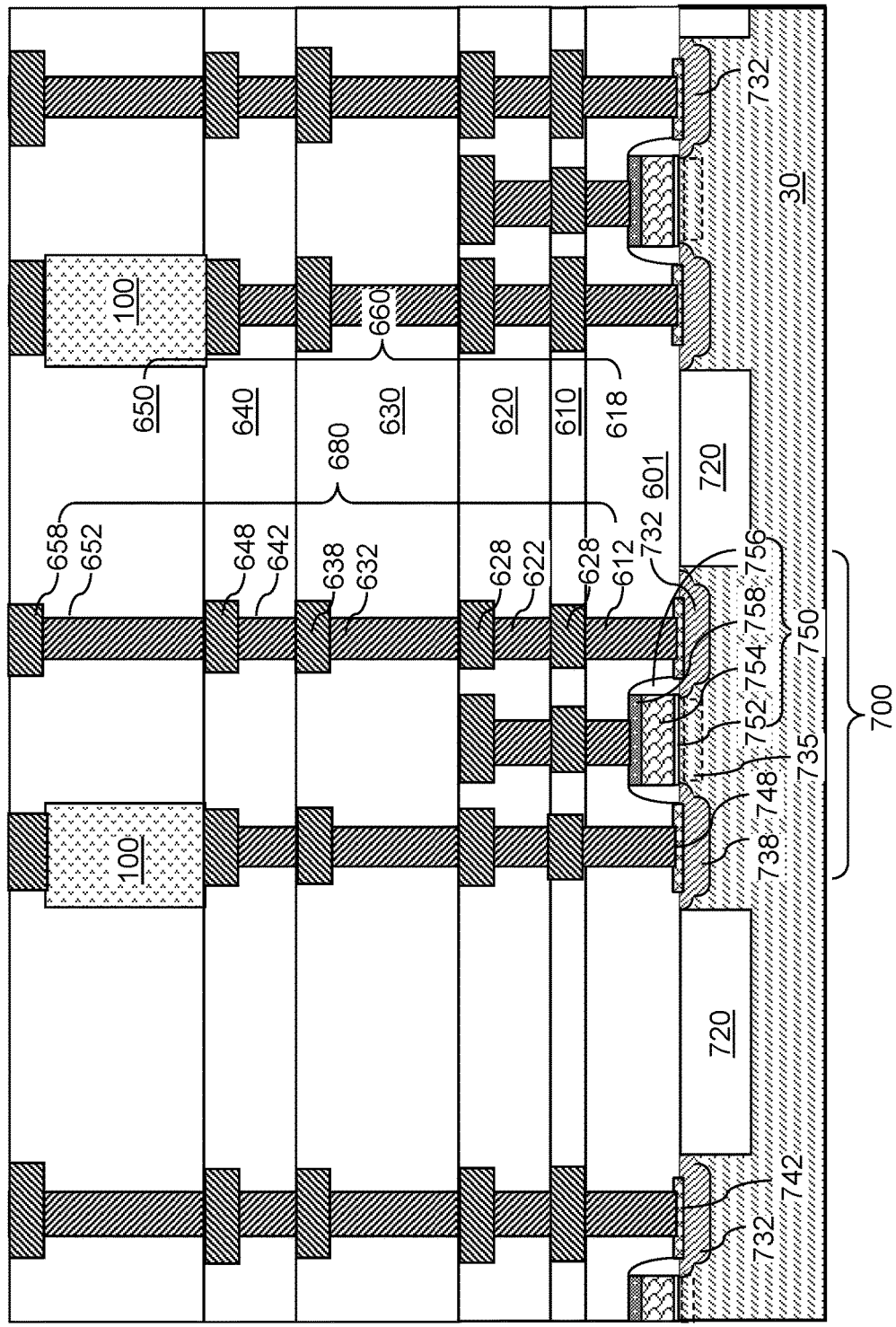
FIG. 3 is a vertical sectional view of a memory device including a phase-change memory cell and a FET, according to various embodiments of the present disclosure.

FIG. 3 is a cross sectional view of a memory device 200, according to various embodiments of the present disclosure. With reference to FIGS. 1-3, the memory device 200 includes one or more phase-change memory cells 100 and corresponding field effect transistors (FETs) 700, disposed on a substrate 30. The memory device 200 can include a two-dimensional array of memory cells arranged in a one transistor-one resistor (1T1R) configuration, i.e., a configuration in which one access transistor is connected to one resistive memory cell.

The substrate 30 can be a semiconductor substrate such as a commercially available silicon substrate. Alternatively, or additionally, the substrate 30 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. Other suitable materials within the contemplated scope of disclosure may also be used.

The FETs 700 may provide functions that are needed to operate the memory cells 100. Specifically, the FETs 700 can be configured to control the programming operation, the erase operation, and the sensing (read) operation of the memory cells 100. In some embodiments, the memory device 200 may include sensing circuitry and/or a top electrode bias circuitry on the substrate 30. The FETs 700 may include complementary metal-oxide-semiconductor (CMOS) transistors. While the embodiment illustrated in FIG. 3 illustrates a CMOS transistor, other FET transistors such as fin FET, thin-film transistors (TFT), etc. may be used as well. The substrate 30 may optionally include additional semiconductor devices (such as resistors, diodes, capacitors, etc.).

Shallow trench isolation structures 720 including a dielectric material such as silicon oxide can be formed in an upper portion of the substrate 30. Suitable doped semiconductor wells, such as p-type wells and n-type wells can be formed within each area that is laterally enclosed by a continuous portion of the shallow trench isolation structures 720. Accordingly, the FETs 700 may be formed on the substrate 30 between the isolation structures 720, such that the FETs 700 may be electrically isolated from one another by the isolation structures 720.

Each FET 700 may include a source region 732, a drain region 738, a semiconductor channel 735 that includes a surface portion of the substrate 30 extending between the source region 732 and the drain region 738, and a gate structure 750. Each gate structure 750 can include a gate dielectric 752, a gate electrode 754, a gate cap dielectric 758, and a dielectric gate spacer 756. A source-side metal-semiconductor alloy region 742 can be formed on each source region 732, and a drain-side metal-semiconductor alloy region 748 can be formed on each drain region 738.

In some embodiments, the channel region 735 may be doped with a first type dopant, and the source region 732 and the drain region 738 may be doped with a second type dopant, opposite to the first type. In the present example, the FET 700 may be an n-type FET (nFET). Accordingly, the channel region 735 may be p-type channel.

In one embodiment, the source region 732 may be formed by a first ion implantation process, and the drain region 738 may be formed by a second ion implantation process. The second ion implantation process may be different from the first ion implantation process in at least one of doping dose, implanting angle and dopant (doping species). In one embodiment, the first ion implantation process includes forming a first patterned mask on the substrate, and applying the first ion implantation to the substrate using the first patterned mask as an implantation mask. The first patterned mask may include an opening such that a substrate region for the source is uncovered thereby. The first patterned mask may be a patterned photoresist layer formed by a lithography process, or alternatively, a patterned hard mask formed by lithography process and etching. Similarly, the second ion implantation process may include forming a second patterned mask on the substrate, and applying the second ion implantation to the substrate using the second patterned mask as an implantation mask. The second patterned mask may include an opening such that a substrate region for the drain is uncovered thereby. The second patterned mask may be similar to the first patterned mask in terms of formation and composition.

Various metal interconnect structures 680 formed in dielectric material layers 660 may be formed over the substrate 30 and the devices formed thereon (such as the FETs 700). The dielectric material layers can include, for example, a contact-level dielectric material layer 601, a first metal-line-level dielectric material layer 610, a second line-and-via-level dielectric material layer 620, a third line-and-via-level dielectric material layer 630, a fourth line-and-via-level dielectric material layer 640, and a fifth line-and-via-level dielectric material layer 650.

The metal interconnect structures 680 may be formed by performing any suitable deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, an electroplating process, or a plasma enhanced CVD (PECVD) process.

The metal interconnect structures may include device contact via structures 612 formed in the contact-level dielectric material layer 601 and that contact respective component of the FETs 700, first metal lines 618 formed in the first metal-line-level dielectric material layer 610, first metal via structures 622 formed in a lower portion of the second line-and-via-level dielectric material layer 620, second metal lines 628 formed in an upper portion of the second line-and-via-level dielectric material layer 620, second metal via structures 632 formed in a lower portion of the third line-and-via-level dielectric material layer 630, third metal lines 638 formed in an upper portion of the third line-and-via-level dielectric material layer 630, third metal via structures 642 formed in a lower portion of the fourth line-and-via-level dielectric material layer 640, fourth metal lines 648 formed in an upper portion of the fourth line-and-via-level dielectric material layer 640, fourth metal via structures 652 formed in a lower portion of the fifth line-and-via-level dielectric material layer 650, and fifth metal lines 658 formed in an upper portion of the fifth line-and-via-level dielectric material layer 650. In one embodiment, the metal interconnect structures 680 can include source lines that are connected to a source-side power supply for an array of memory elements. The voltage provided by the source lines can be applied to the bottom electrodes through the access transistors provided in the memory array region 100.

Each of the dielectric material layers (601, 610, 620, 630, 640, 650) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648, 658) may include at least one conductive material, which can be a combination of a metallic liner layer (such as a metallic nitride or a metallic carbide) and a metallic fill material. Each metallic liner layer can include TiN, TaN, WN, TiC, TaC, and WC, and each metallic fill material portion can include W, Cu, Al, Co, Ru, Mo, Ta, Ti, alloys thereof, and/or combinations thereof. Other suitable materials within the contemplated scope of disclosure may also be used. In one embodiment, the first metal via structures 612 and the first metal line 618 may be formed as integrated line and via structures by a dual damascene process, the second metal via structure 622 and the second metal lines 628 may be formed as integrated line and via structures by a dual damascene process, the third metal via structures 632 and the third metal lines 638 may be formed as integrated line and via structures by a dual damascene process, the fourth metal via structures 642 and the fourth metal lines 648 may be formed as integrated line and via structures by a dual damascene process, and/or the fifth metal via structures 652 and the fourth metal lines 648 may be formed as integrated line and via structures by a dual damascene process.

In some embodiments, the memory cells 100 may be disposed within the fifth dielectric material layer 650, and each memory cell 100 may be electrically connected to a respective fourth metal line 648 and a fifth metal line 658. However, the present disclosure is not limited to any particular location for the memory cells 100. For example, the memory cells 100 may be disposed within any of the dielectric material layers 660.

The metal interconnect structures 680 may be configured to connect each memory cell 100 to a corresponding FET 700, and to connect the FET 700 to corresponding signal lines. For example, the drain region 738 of the FET 700 may be electrically connected to a bottom electrode of the memory cell 100 via, for example, a subset of the metallic via structures (612, 622, 632, 642) and a subset of the metal lines (618, 628, 638, 648). Each drain region 738 may be connected to a first node (such as a bottom node) of a respective memory cell 100 via a respective subset of the metal interconnect structures 680. The gate electrode 754 of each FET 700 may be electrically connected to a word line, which can be embodied as a subset of the metal interconnect structures 680. A top electrode of each memory cell 100 may be electrically connected to a respective bit line, which is embodied as a respective subset of the metal interconnect structures. Each source region 732 may be electrically connected to a respective source line, which is embodied as a respective subset of the metal interconnect structures. While only five levels of metal lines are illustrated in FIG. 3, it is understood that more metal line levels can be formed above the illustrated levels of FIG. 3. Further, it is understood that the levels in which the source lines, word lines, and bit lines are formed may be selected based on design parameters.

Figure 4A:
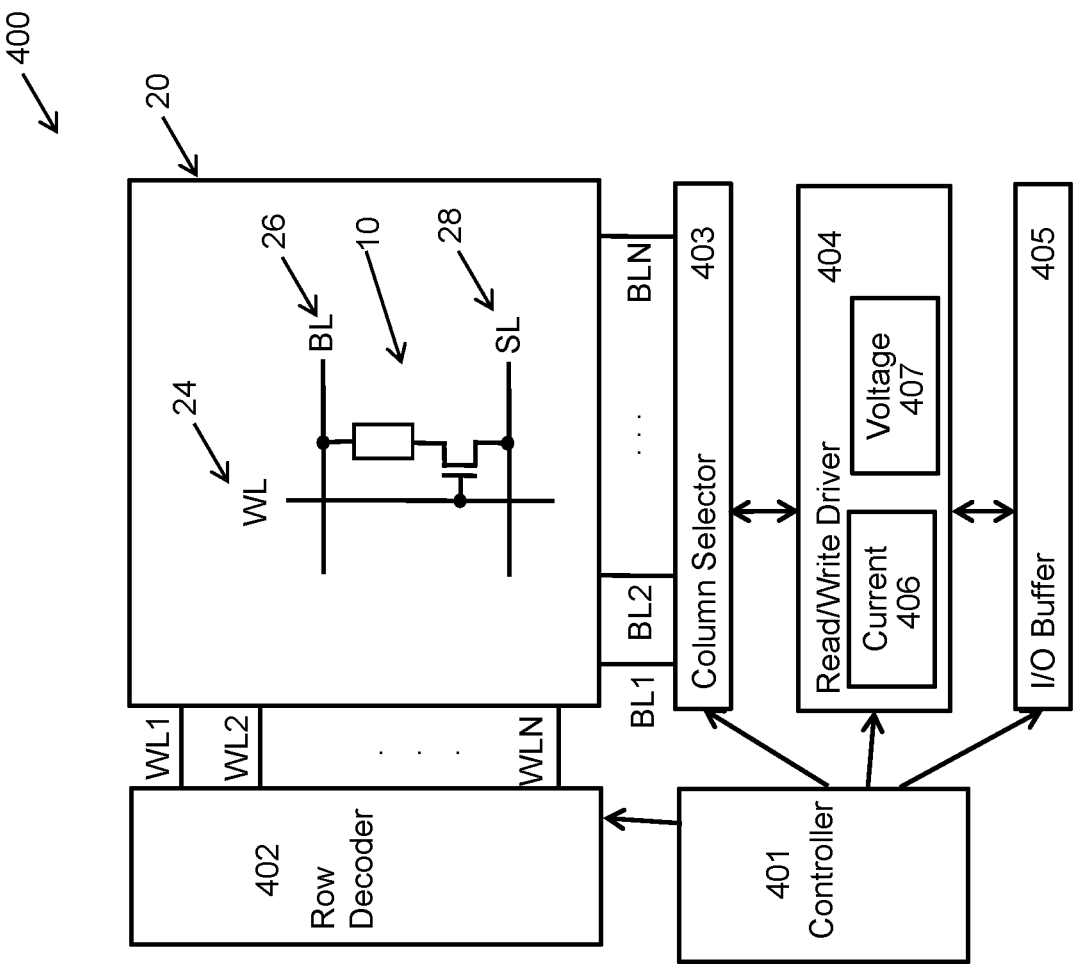
FIG. 4A is a block diagram of a memory circuit, according to various embodiments of the present disclosure.

FIG. 4A is a block diagram of a memory circuit 400, according to various embodiments of the present disclosure. With reference to FIGS. 1-4A, the memory circuit 400 may be configured to implement various embodiment methods for configuring a memory structure, such as a PCRAM cell 100 of a PCRAM structure 10. The memory circuit 400 may be configured to control an operating mode (e.g., SLC mode and/or MLC mode) of the PCRAM structure that is part of a memory structure, such as a PCRAM cell 100 of a PCRAM structure 10 that is part of a memory structure 20 having a plurality of PCRAM cells 100 and/or to control the RESET program conditions used in programming the PCRAM structure. For example, the memory circuit 400 may be configured to implement operations of methods 500, 510, 600, 621, 780, 790, and/or 800 described below with reference to FIGS. 5A-8. Only a single structure 10 is illustrated in FIG. 4A for ease of illustration, but additional structures 10 may be included in the memory structure 20 as discussed above.

The memory circuit 400 may include a controller 401, a row decoder 402, a column selector 403, a read/write driver 404, and one or more input/output (I/O) buffers 405. In various embodiments, the controller 401 may be coupled to the row decoder 402 and the column selector 403. In various embodiments, the row decoder 402 may be coupled to the write lines (WL), such as write lines 24 discussed above, of the memory structure 20. The memory structure 20 may include any number of WLs 1-N, where N is an integer. The column selector 403 may be coupled to the bit lines (BL), such as bit lines 26 discussed above, of the memory structure 20. The memory structure 20 may include any number of BLs 1-N, where N is an integer. The controller 401 may additionally be coupled to the read/write driver 404 and/or the one or more I/O buffers 405. The one or more I/O buffers 405 and read/write driver 404 may be coupled to one another and/or coupled to the column selector 403. The controller 401 may receive various signals from external circuitry related to the circuit 400. For example, the controller 401 may receive commands, such as configuration change commands, from a host controller or processor to transition a PCRAM cell 100 from a SLC mode of operation to a MLC mode of operation or from a MLC mode of operation to a SLC mode of operation. The controller 401 may determine a type of a received configuration change command to determine whether the received configuration change command is a SLC mode to MLC mode type configuration change command or a MLC to SLC mode type configuration change command. The controller 401 may transmit signals to the row decoder 402, column selector 403, and/or read/write driver 404 to cause the row decoder 402, column selector 403, and/or read/write driver 404 to perform operations to change the states of the PCRAM cells 100 and/or sense the states of the PCRAM cells 100. For example, the controller 401 may transmit signals to the row decoder 402, column selector 403, and/or read/write driver 404 to cause the row decoder 402, column selector 403, and/or read/write driver 404 to perform operations to perform READ, SET, and/or RESET operations for the PCRAM cells 100 and/or to sense the current of the PCRAM cell 100 (e.g., $I_{cell}$). In various embodiments, the controller 401 may select different RESET program conditions based at least in part on a determined type of a received configuration change command. For example, a RESET program condition configured to generate a waveform with a selected current amplitude and/or pulse width may be selected in response to determining that a received configuration change command is a SLC mode to MLC mode type configuration change command and a different RESET program condition configured to generate a waveform with another selected current amplitude and/or another pulse width may be selected in response to determining that a received configuration change command is a MLC mode to SLC mode type configuration change command. In various embodiments, the controller 401 may transmit signals to the row decoder 402, column selector 403, and/or read/write driver 404 to cause the row decoder 402, column selector 403, and/or read/write driver 404 to perform operations to program the PCRAM cell 100 using the selected RESET program conditions.

In various embodiments, the read/write driver 404 may include a current sensing circuit 406 and a voltage sensing circuit 407. In various embodiments, the read/write driver 404, and/or the current sensing circuit 406 specifically, may be configured to apply a selected read voltage (e.g., $V_{read}$) to a PCRAM cell 100, and the current sensing circuit 406 may be configured to sense the resulting cell current ($I_{cell}$). In various embodiments, the read/write driver 404, and/or the current sensing circuit 406 specifically, may be configured to store the sensed cell current ($I_{cell}$) in the one or more I/O buffers 405. In various embodiments, the read/write driver 404, and/or the voltage sensing circuit 407 specifically, may be configured to apply a selected read current (e.g., $I_{read}$) to a PCRAM cell 100, and the voltage sensing circuit 407 may be configured to sense the resulting cell voltage ($V_{cell}$). In various embodiments, the read/write driver 404, and/or the voltage sensing circuit 407 specifically, may be configured to store the sensed cell voltage ($V_{cell}$) in the one or more I/O buffers 405.

In various embodiments, the one or more I/O buffers 405 may be one or more buffers providing storage for current sensing and/or voltage sensing results of the memory structure 20, such as $I_{cell}$, $V_{cell}$, etc. Additionally, the one or more I/O buffers 405 may store other values, such as results of comparing current sensing and/or voltage sensing (e.g., $I_{cell}$, $V_{cell}$, etc.) to stored threshold values, threshold values themselves (e.g., verification current conditions, verification voltage conditions, etc.), RESET program conditions (e.g., waveform attributes, such as current amplitudes, pulse widths, etc.), etc. In various embodiments, the one or more I/O buffers 405 may be configured to output values, such as $I_{cell}$, $V_{cell}$, threshold values, RESET program conditions, etc., to other circuitry, such as the controller 401 and/or other external circuitry related to the memory circuit 400.

Various embodiments disclosed herein provided methods for operating a memory structure, such as a PCRAM cell 100 of a PCRAM structure 10, in a SLC mode for lower power and a MLC mode for lower variability. Specifically, various embodiments may account for RESET program conditions in operating a memory structure, such as a PCRAM cell 100 of a PCRAM structure 10, in both SLC modes and MLC modes. Conventional RESET operations apply the same RESET program condition whether a memory structure, such as a PCRAM cell 100 of a PCRAM structure 10, is operating in a SLC mode or a MLC mode. In contrast to conventional RESET operations that are the same regardless of operating mode (i.e., the same for SLC mode and MLC mode), various embodiments provide different RESET program conditions based on the operating mode, such as one RESET program condition for SLC mode and another different RESET program condition for MLC mode. Various embodiments may provide commands to configure a memory structure, such as a PCRAM cell 100 of a PCRAM structure 10, from a SLC mode to a MLC mode and/or commands to configure a memory structure, such as a PCRAM cell 100 of a PCRAM structure 10, from a MLC mode to a SLC mode. Compared to conventional RESET operations, the various embodiment RESET operations and/or commands to move between SLC modes and MLC modes may enable a memory structure, such as a PCRAM cell 100 of a PCRAM structure 10, to achieve tighter MLC resistance distribution in a MLC mode and/or lower program energy consumption in a SLC mode.

Various embodiments disclosed herein provide commands to configure a memory structure, such as a PCRAM cell 100 of a PCRAM structure 10, from a SLC mode to a MLC mode and/or commands to configure a memory structure, such as a PCRAM cell 100 of a PCRAM structure 10, from a MLC mode to a SLC mode, may be suitable for use in controlling artificial intelligence (AI) hardware operations, such as AI hardware including one or more PCRAM structures 10.

One example of AI hardware may include a hardware-based neural network (e.g., a hardware-based deep neural network (DNN) or any other type artificial neural network (ANN)) in which in-memory computing may be used to implement layers of the neural network. In-memory computing approaches may provide benefits to implementing neural networks, such as DNNs, in comparison to von Neumann computing architectures. For example, a hardware-based neural network may achieve performance and energy efficiency in comparison to a von Neumann computing architecture implemented neural network.

A neural network implementation may often include artificial neurons. A signal at a connection between artificial neurons in the neural network is often a real number. The output of each artificial neuron in the neural network may be computed by a non-linear function of the sum of the inputs to the artificial neuron. The connections between artificial neurons may have a weight that adjusts as learning/training of the neural network to a task is performed. The weight may adjust up or down indicating an increase or decrease in a strength of a signal at the connection between two artificial neurons. In many implementations, artificial neurons may be aggregated into layers, and a neural network may be configured such that different layers perform different transformations on the inputs those respective layers receive. Signals in the neural network travel from a first layer of the neural network to a last layer of the neural network and may travel through a layer more than once in some implementations. As an example, a layer (e.g., k) of a neural network may receive a number (e.g., i) of layer inputs (e.g., $X_i$) and apply filter weights (e.g., $W_{k,i}$) to the layer inputs to output a layer output (e.g., $Y_k$) to a next layer according to the function $Y_k = \Sigma W_{k,i} \times X_i$.

Figure 4B:
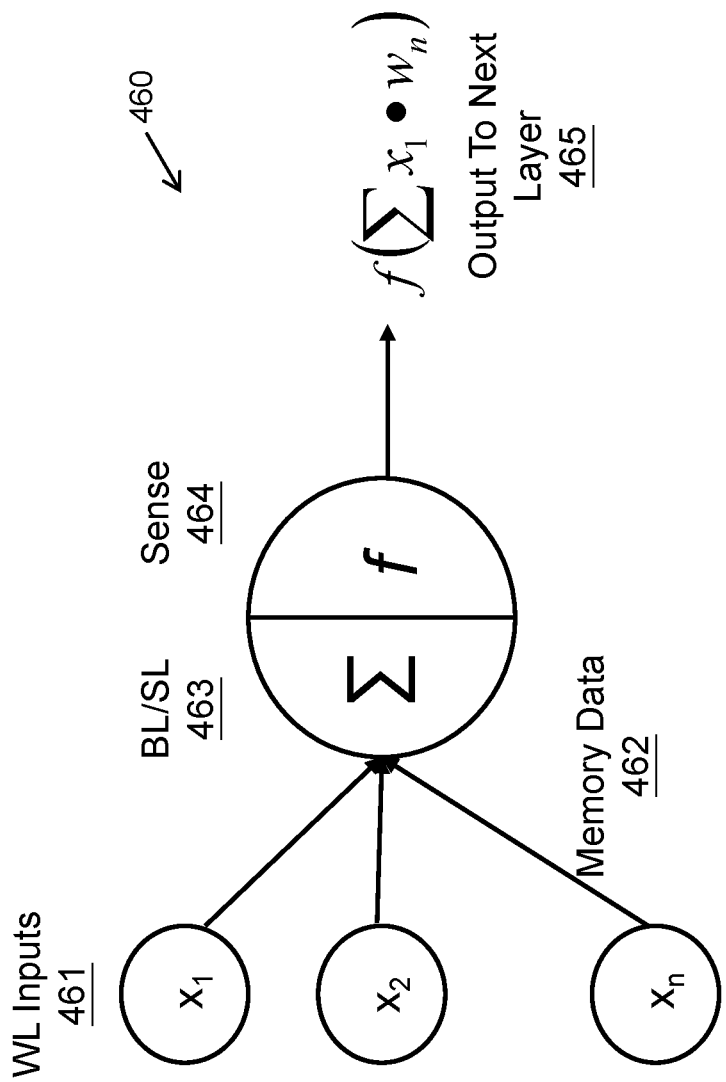
FIG. 4B is a block diagram of aspects of a simplified layer of a neural network, according to various embodiments of the present disclosure.

FIG. 4B is a block diagram of aspects of a simplified layer 460 of a neural network, according to various embodiments of the present disclosure. With reference to FIGS. 1-4B, the layer 460 may be implemented on a memory structure 20 having a plurality of PCRAM cells 100 (e.g., an array of PCRAM cells 100). The inputs of the layer 460 may be write line (WL) inputs 461, such as inputs to write lines 24 discussed above. There may be any number of WL inputs 461, such as 1-n inputs, labeled $X_1$ to $X_n$ in FIG. 4B. The weights for the layer 460 may be memory data 462, such as the equivalent resistance of the PCRAM structure 10. The bit line (BL) values, such as values of bit lines 26 discussed above, and/or source line (SL) values, such as values of source lines 28 discussed above, illustrated as BL/SL 463 in FIG. 4B may be provided to a sensing circuit 464, such as a sense amplifier of a read/write driver (e.g., read/write driver 404), and the sense result may be the output to the next layer 465.

Figure 4C:
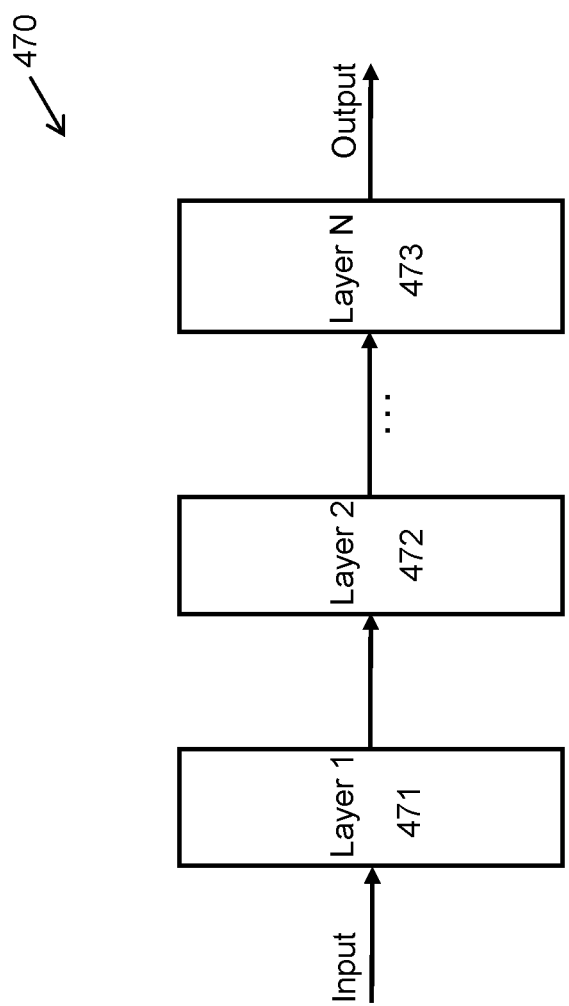
FIG. 4C is a block diagram of a neural network having multiple layers, according to various embodiments of the present disclosure.

FIG. 4C is a block diagram of an example neural network 470 having multiple layers 1-N, according to various embodiments of the present disclosure. With reference to FIGS. 1-4C, the neural network 470 may include a first layer 471, a second layer 472, and any number of additional layers up to a Nth layer 473. Inputs to the neural network 470 may pass through the layers 471 to 473 one or more times and the resulting output after the last pass through the last layer, such as layer 473, may be the output of the neural network. As an example, each layer 471 to 473 may be similar to layer 460 discussed above and may be implemented as a hardware-based layer on a memory structure 20 having a plurality of PCRAM cells 100 (e.g., an array of PCRAM cells 100).

Each layer of the neural network 470 may have its own respective requirements and/or may perform its own assigned task. For example, the first layer 471 may perform a first task and have a first error tolerance. The second layer 472 may perform a second task and have a second error tolerance. The first task may be the same or different than the second task and/or the first error tolerance may be the same or different than the second error tolerance. As one example, the neural network 470 may be a neural network configured for image classification and detection and the first layer 471 may be a convolution layer with a first error tolerance and the second layer 472 may be a fully connected layer with a second error tolerance more stringent (e.g., lower acceptable error rate) than the first error tolerance. While neural network 470 is a simplified representation of a neural network, neural networks suitable for use with the various embodiments may be of more complex design and may include any neural network architecture, examples of which may include neural network models such as CF-VGG, VGG16, ResNet50, TiGRU, etc.

When a neural network, such as neural network 470 or any other type of neural network, is implemented in hardware, such as at least partially in a memory structure 20 having a plurality of PCRAM cells 100 (e.g., an array of PCRAM cells 100), the different requirements and/or tasks associated with different layers of the neural network may benefit from operating in different modes, such as one or more layer operating in a SLC mode and/or one or more layer operating in a MLC mode. As one example, SLC mode operations may have a higher robustness and be less prone to error (or fault) than MLC mode operations. As another example, MLC mode operations may be more efficient than SLC mode operations such that MLC mode operations may be performed with fewer PCRAM cells 100, have less latency, and/or use less energy than SLC mode operations. As discussed herein, the terms "error" and "fault" may be used interchangeably to refer to bit errors and/or bit faults of a PCRAM cell, such as a PCRAM cell 100 of a PCRAM structure 10. The potential different characteristics of SLC mode operations and MLC mode operations may be associated with different layers of a neural network, such as neural network 470. For example, a layer of a neural network, such as neural network 470, having an error (or fault) tolerance above a threshold (e.g., an acceptable error rate higher than a threshold error rate) may be associated with MLC mode operations. As the error tolerance may be relatively high (e.g., above the threshold) the error tolerance may support MLC operation of a PCRAM cell, such as a PCRAM cell 100 of a PCRAM structure 10, and the PCRAM cell may benefit from the reduced area, reduced latency, and reduced energy benefits provided by shifting to (or remaining in) MLC mode operations. As another example, a layer of a neural network, such as neural network 470, having an error (or fault) tolerance below a threshold (e.g., an acceptable error rate lower than a threshold error rate) may be associated with SLC mode operations. As the error tolerance may be relatively low (e.g., at or below the threshold) the error tolerance may support SLC operation of a PCRAM cell, such as a PCRAM cell 100 of a PCRAM structure 10, and the PCRAM cell may benefit from the higher robustness provided by SLC mode operations by shifting to (or remaining in) SLC mode operations.

In some embodiments, a PCRAM cell, such as a PCRAM cell 100 of a PCRAM structure 10, may be shifted into (or remain in) SLC mode in response to determining that an error tolerance for a neural network layer supports SLC mode operation for the PCRAM cell or determining that an error tolerance for the neural network layer does not support MLC mode operation for the PCRAM cell. In some embodiments, a PCRAM cell, such as a PCRAM cell 100 of a PCRAM structure 10, may be shifted into (or remain in) MLC mode in response to determining that an error tolerance for a neural network layer supports MLC mode operation for the PCRAM cell or determining that an error tolerance for the neural network layer does not support SLC mode operation for the PCRAM cell. Shifting to (or remaining in) SLC mode may enable a neural network layer with a more stringent bit error tolerance to have better reliability than if that neural network layer operated in MLC mode. Shifting into (or remaining in) MLC mode may enable a neural network layer with a less stringent bit error tolerance to use less area, operate faster, and/or use less energy than if that neural network layer operated in SLC mode. In various embodiments, a PCRAM cell, such as a PCRAM cell 100 of a PCRAM structure 10, may shift from MLC mode to SLC mode (or MLC mode to SLC mode) on a layer-by-layer basis as each subsequent layer is executed for a neural network, such as neural network 470.

Figure 4D:
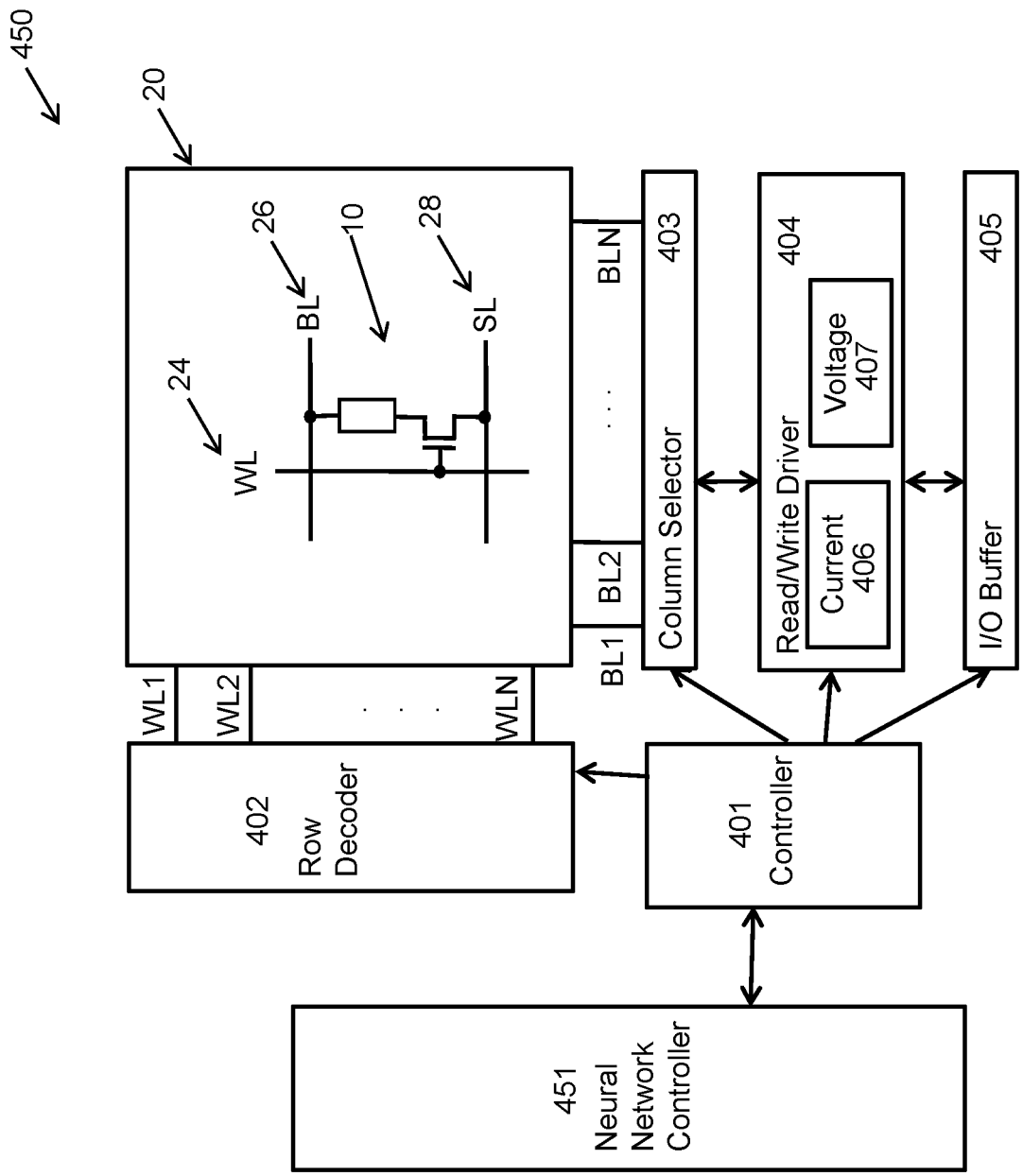
FIG. 4D is a block diagram of another memory circuit, according to various embodiments of the present disclosure.

FIG. 4D is a block diagram of a memory circuit 450, according to various embodiments of the present disclosure. With reference to FIGS. 1-4D, the memory circuit 450 may be configured to implement various embodiment methods for configuring a memory structure, such as a PCRAM cell 100 of a PCRAM structure 10. The memory circuit 450 may be similar to memory circuit 400 described above, and may further include a neural network controller 451. The memory circuit 450 may be configured to control an operating mode (e.g., SLC mode and/or MLC mode) of the PCRAM structure that is part of a memory structure, such as a PCRAM cell 100 of a PCRAM structure 10 that is part of a memory structure 20 having a plurality of PCRAM cells 100 and/or to control the RESET program conditions used in programming the PCRAM structure. For example, the memory circuit 450 may be configured to implement operations of methods 500, 510, 600, 621, 780, 790, and/or 800 described below with reference to FIGS. 5A-8. Only a single structure 10 is illustrated in FIG. 4B for ease of illustration, but additional structures 10 may be included in the memory structure 20 as discussed above.

The neural network controller 451 may receive various signals from external circuitry related to the circuit 450. For example, the neural network controller 451 may receive neural network layer execution indications, from a host controller or processor. A neural network layer execution indication may be an indication that one or more computations for a next layer of a neural network are to be executed by the circuit 450, such as by one or more PCRAM cell 100 of the circuit 450. The neural network layer execution indication may indicate the type of neural network layer to be executed and/or an error tolerance for the neural network layer. The neural network controller 451 may determine whether an error tolerance for the neural network layer supports MLC mode operation and/or supports SLC mode operation. As one example, the neural network controller 451 may receive a neural network layer execution indication indicating a type of a next layer to be executed for a neural network.

The network controller 451 may perform operations to determine an error tolerance associated with the type of the next layer to be executed for the neural network, such as by retrieving the value of an error tolerance from a memory and/or parsing the neural network layer execution indication when the error tolerance is included in the neural network execution indication. The network controller 451 may perform operations to determine whether the error tolerance for the next layer to be executed for the neural network supports MLC operation for a PCRAM cell 100 and/or may perform operations to determine whether the error tolerance for the next layer to be executed for the neural network supports SLC operation for a PCRAM cell 100. As one specific example, the determined error tolerance may be compared to a threshold for error tolerance associated with MLC mode operation, and the determined error tolerance being higher than the threshold for error tolerance associated with MLC mode operation may indicate the error tolerance supports MLC mode. The determined error tolerance being at or below the threshold for error tolerance associated with MLC mode operation may indicate the error tolerance does not support MLC mode. As another specific example, the determined error tolerance may be compared to a threshold for error tolerance associated with SLC mode operation, and the determined error tolerance being lower than the threshold for error tolerance associated with SLC mode operation may indicate the error tolerance supports SLC mode. The determined error tolerance being at or above the threshold for error tolerance associated with SLC mode operation may indicate the error tolerance does not support SLC mode.

The neural network controller 451 may track and/or determine the state of one or more PCRAM cells 100 in the circuit 450, such as whether any PCRAM cell 100 is in a SLC mode and/or a MLC mode. The neural network controller 451 may be configured to perform operations to generate configuration change commands associated with one or more PCRAM cells 100, such as SLC mode to MLC mode type configuration change commands and/or MLC to SLC mode type configuration change commands. The neural network controller 451 may be configured to perform operations to determine whether a PCRAM cell 100 is in MLC mode or SLC mode in response to determining error tolerance supports MLC mode and/or in response to determining error tolerance does not support MLC mode. The neural network controller 451 may be configured to perform operations to determine whether a PCRAM cell 100 is in MLC mode or SLC mode in response to determining error tolerance supports SLC mode and/or in response to determining error tolerance does not support SLC mode. When the PCRAM cell 100 is in SLC mode, the neural network controller 451 may be configured to perform operations to generate a SLC mode to MLC mode type configuration change command in response to determining error tolerance supports MLC mode and/or in response to determining error tolerance does not support SLC mode. When the PCRAM cell 100 is in MLC mode, the neural network controller 451 may be configured to take no action in response to determining error tolerance supports MLC mode and/or in response to determining error tolerance does not support SLC mode, thereby causing the PCRAM cell 100 to remain in MLC mode. When the PCRAM cell 100 is in MLC mode, the neural network controller 451 may be configured to perform operations to generate a MLC mode to SLC mode type configuration change command in response to determining error tolerance supports SLC mode and/or in response to determining error tolerance does not support MLC mode. When the PCRAM cell 100 is in SLC mode, the neural network controller 451 may be configured to take no action in response to determining error tolerance supports SLC mode and/or in response to determining error tolerance does not support MLC mode, thereby causing the PCRAM cell 100 to remain in SLC mode.

The neural network controller 451 may transmit signals, such as signals including configuration change commands associated with one or more PCRAM cells 100, to the controller 401 to cause the controller 401 to perform operations to change the states of the PCRAM cells 100 and/or sense the states of the PCRAM cells 100.

While the neural network controller 451 is illustrated in FIG. 4D as a separate component from the controller 401, the operations discussed herein as being performed by the neural network controller 451 may alternatively be implemented by the controller 401.

Figure 4E:
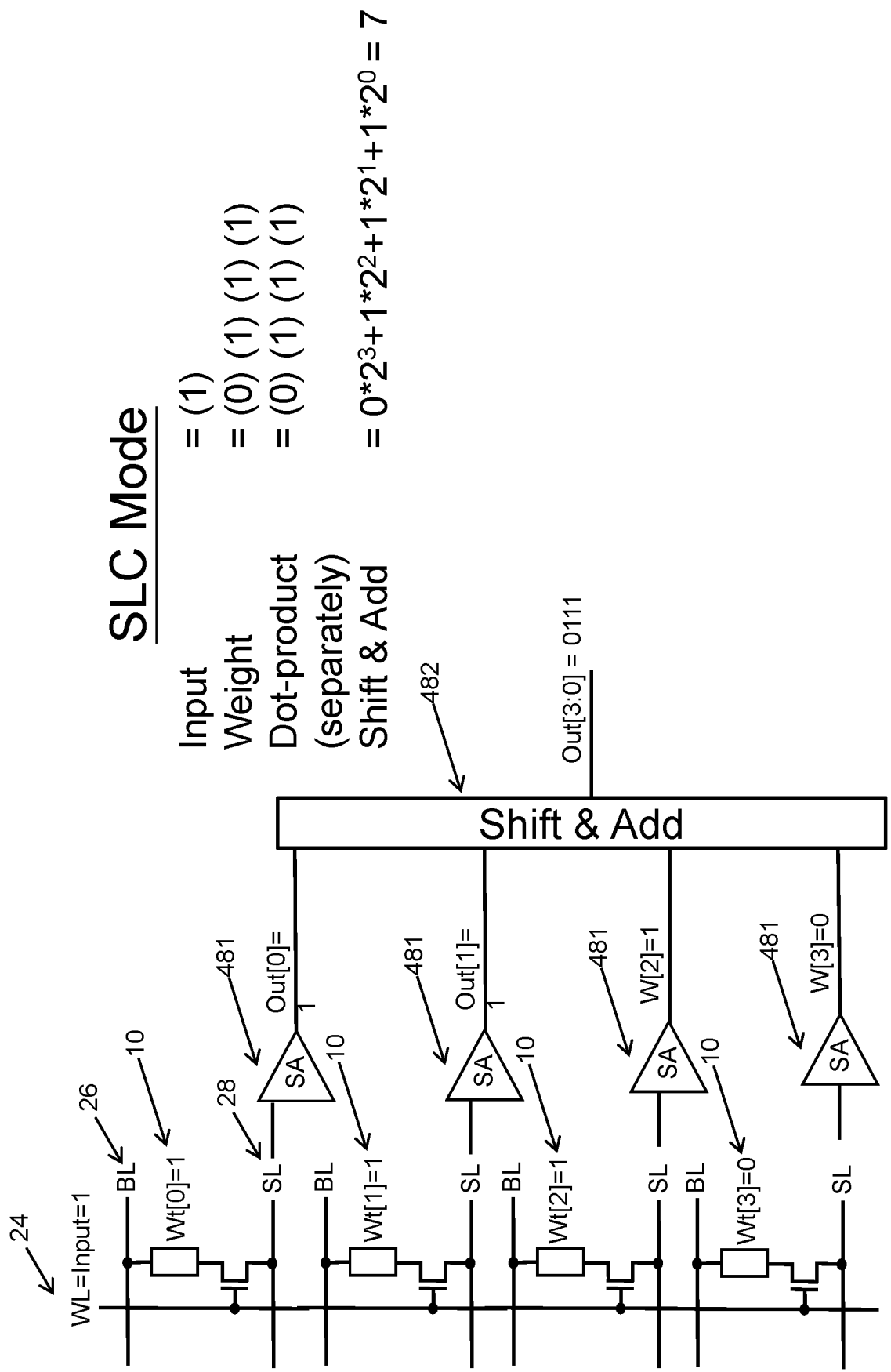
FIG. 4E is a block diagram of an example dot-product computation performed using PCRAM cells operating in single-level-cell (SLC) mode, according to various embodiments of the present disclosure.
Figure 4F:
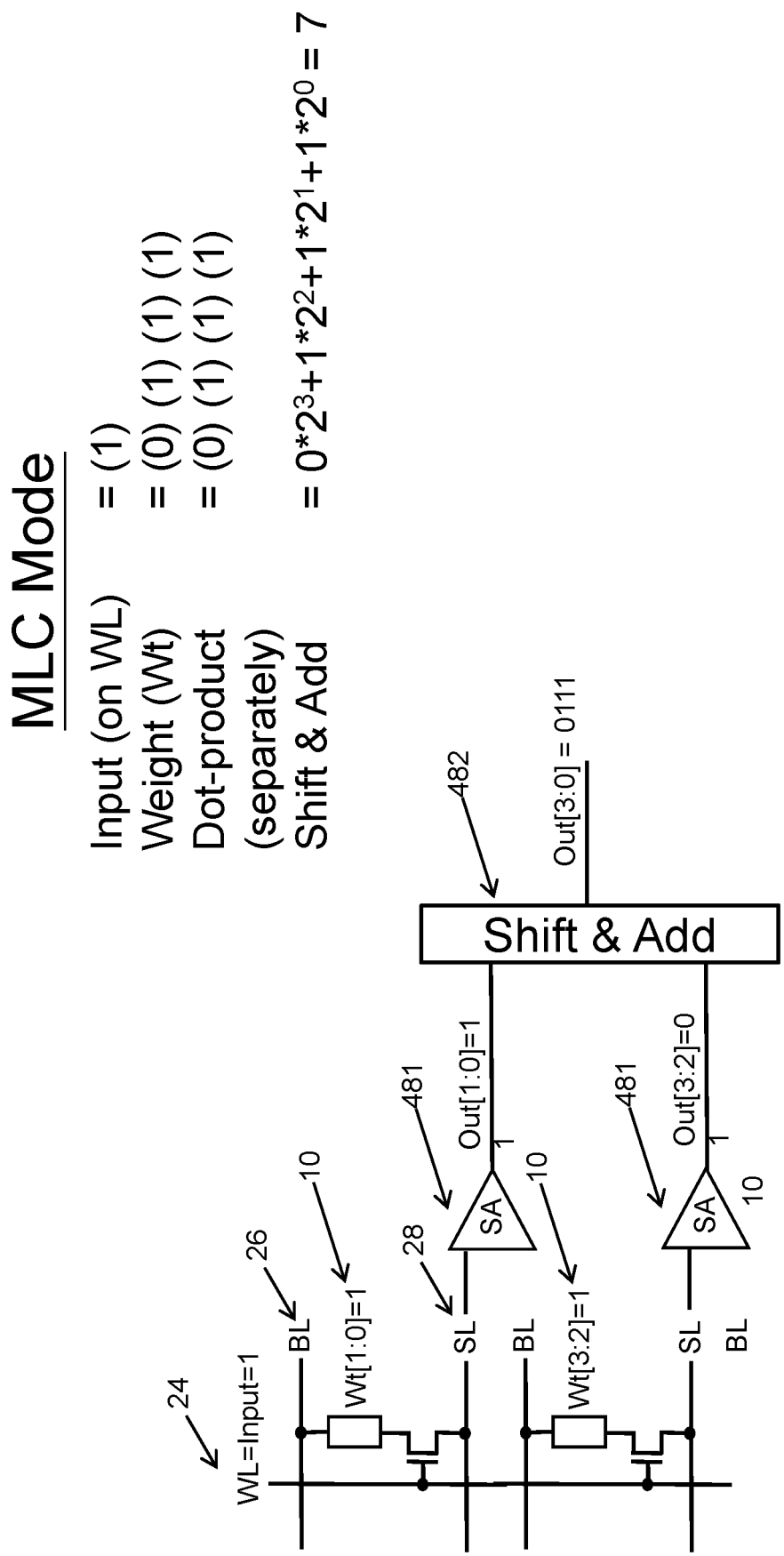
FIG. 4F is a block diagram of an example dot-product computation performed using PCRAM cells operating in multi-level cell (MLC) mode, according to various embodiments of the present disclosure.

FIG. 4E is a block diagram of an example dot-product computation performed using PCRAM cells, such as PCRAM cells 100 of PCRAM structures 10, operating in SLC mode, according to various embodiments of the present disclosure. FIG. 4F is a block diagram of an example dot-product computation performed using PCRAM cells, such as PCRAM cells 100 of PCRAM structures 10, operating in MLC mode, according to various embodiments of the present disclosure. With reference to FIGS. 1-4F, the example SLC mode operations of FIG. 4E and the example MLC mode operations of FIG. 4F compare the efficiency of a memory circuit 400, 450 executing the same layer of a neural network in SLC mode (FIG. 4E) and in MLC mode (FIG. 4F). The example SLC mode (FIG. 4E) layer computation may require four PCRAM structures 10 connected to four sense amplifiers 481 to execute the layer. The example MLC mode (FIG. 4F) layer computation may require two PCRAM structures 10 connected to two sense amplifiers 481 to execute the layer. As such, the MLC mode (FIG. 4F) may require less PCRAM area (e.g., less PCRAM structures) than the SLC mode (FIG. 4F) to perform the same layer. As such, the MLC mode (FIG. 4F) may use fewer memory devices (e.g., less PCRAM structures 10) than the SLC mode (FIG. 4E) thereby realizing an area benefit for the MLC mode (FIG. 4F) over the SLC mode (FIG. 4E). Additionally, the number/size of the components in the shift and add circuitry 482 may be less in the MLC mode (FIG. 4F) than in the SLC mode (FIG. 4E), thereby realizing a latency and/or energy benefit for the MLC mode (FIG. 4F) over the SLC mode (FIG. 4E).

FIGS. 4E and 4F illustrate that the same input on the WL 24 of (1) in the SLC mode (FIG. 4E) and MLC mode (FIG. 4F) results in the same output of binary value [0111] or value of "7". The SLC mode (FIG. 4E) approach performs the dot-product of each bit-significance separately and combines them afterward outside the memory macro in the shift and add circuitry 482. In the SLC mode (FIG. 4E) approach each weight (0), (1), (1), (1) is represented by its own PCRAM cell 100. The MLC mode (FIG. 4F) enables the weights to be represented by multiple levels such that two weights together (01) are represented by a first PCRAM cell 100 and the other two weights (11) are represented by a second PCRAM cell 100. The shift and add operations are thereby reduced from four to two operations as well in the MLC mode (FIG. 4F).

Figure 5A:
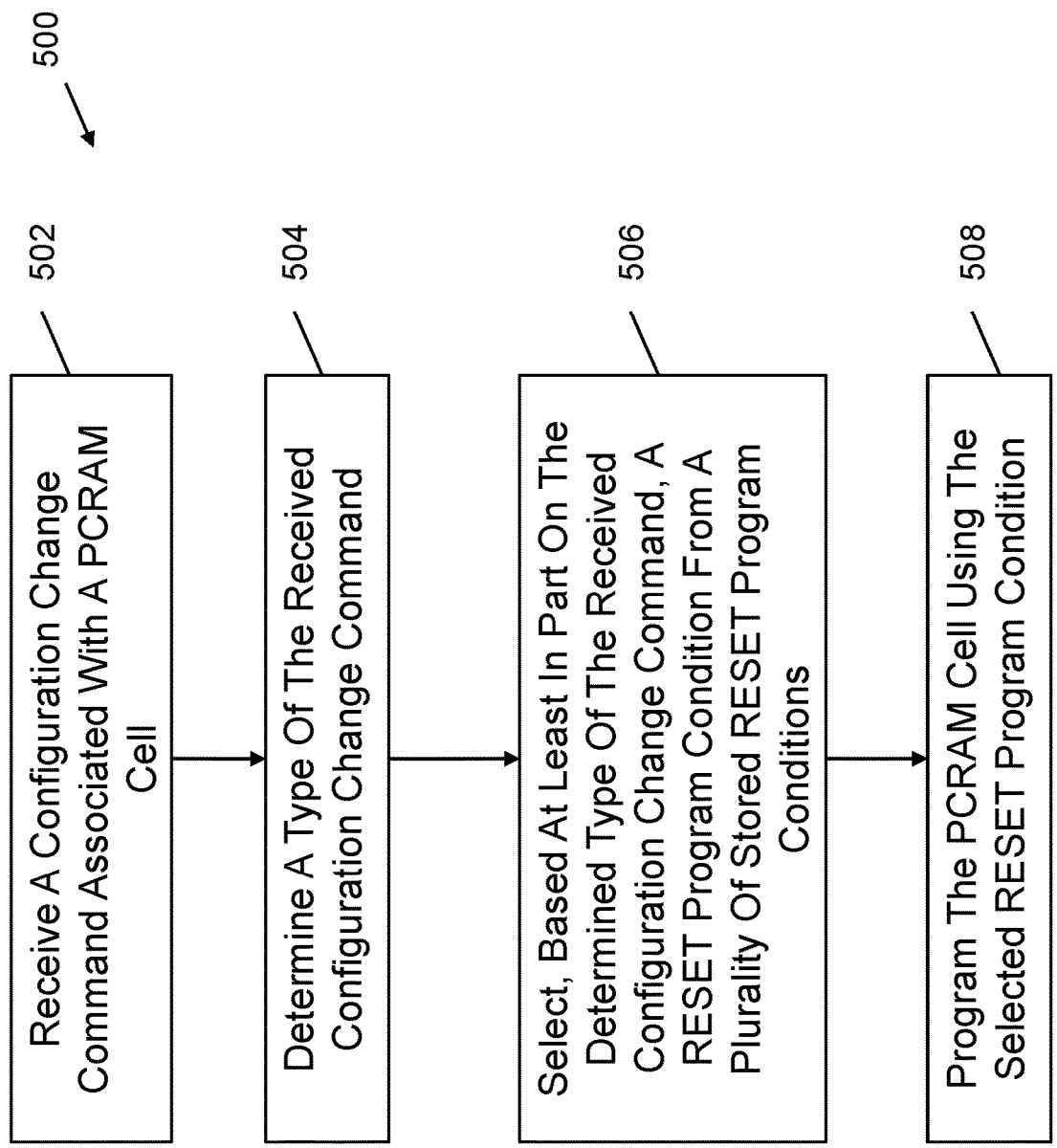
FIG. 5A is a process flow diagram illustrating a method for configuring a PCRAM cell, according to various embodiments of the present disclosure.

FIG. 5A is a process flow diagram illustrating a method 500 for configuring a PCRAM cell, such as a PCRAM cell 100 of a PCRAM structure 10, according to various embodiments of the present disclosure. With reference to FIGS. 1-5A, in various embodiments, the operations of method 500 may be performed by a memory circuit, such as memory circuit 400, 450, including a PCRAM structure, such as PCRAM structure 10.

In block 502, the memory circuit 400, 450 may receive a configuration change command associated with a PCRAM cell, such as a PCRAM cell 100 of a PCRAM structure 10. Various embodiments may include commands, such as configuration change commands, to configure a memory structure, such as a PCRAM cell 100 of a PCRAM structure 10, between SLC and MLC modes. In some embodiments, a host device, such as a host controller or processor, may issue a configuration change command to a memory controller, such as controller 401 of memory circuit 400, 450. As one example, a configuration change command may be a SLC mode to MLC mode type configuration change command instructing the memory controller, such as controller 401 of memory circuit 400, 450, to transition a memory structure, such as a PCRAM cell 100 of a PCRAM structure 10 that is part of a memory structure 20 having a plurality of PCRAM cells 100 (e.g., an array of PCRAM cells 100), from a SLC mode to a MLC mode. As another example, a configuration change command may be a MLC mode to SLC mode type configuration change command instructing the memory controller, such as controller 401 of memory circuit 400, 450, to transition a memory structure, such as a PCRAM cell 100 of a PCRAM structure 10 that is part of a memory structure 20 having a plurality of PCRAM cells 100 (e.g., an array of PCRAM cells 100), from a MLC mode to a SLC mode.

In block 504, the memory circuit 400, 450 may determine a type of the received configuration change command. Various embodiments may include a memory controller, such as controller 401 of memory circuit 400, 450, determining a type of a received configuration change command. For example, a memory controller, such as controller 401 of memory circuit 400, 450, may determine whether a received configuration change command is a SLC mode to MLC mode type configuration change command or a MLC mode to SLC mode type configuration change command.

In block 506, the memory circuit 400, 450 may select, based at least in part on the determined type of the received configuration change command, a RESET program condition from a plurality of stored RESET program conditions. In various embodiments, a plurality of different RESET program conditions may be associated with different types of configuration change commands. For example, buffers or other storage devices, such as I/O buffers 405, may store a plurality of different RESET program conditions, each associated with different types of configuration change commands. As a specific example, one location may store a RESET program condition associated with a MLC mode to SLC mode type configuration change command and another location may store a RESET program condition associated with a SLC mode to MLC mode type configuration change command. In various embodiments, the RESET program conditions may be configured such that when selected and used (e.g., loaded, accessed, etc.), a RESET program condition causes a memory controller, such as controller 401 of memory circuit 400, 450, to generate a waveform having a current amplitude of a current value indicated by the RESET program condition and/or a pulse width indicated by the RESET program condition.

As a specific example, the plurality of RESET program conditions may be at least two RESET program conditions, such as a first RESET program condition configured to generate a first waveform having a first current amplitude and a first pulse width and a second RESET program condition configured to generate a second waveform having a second current amplitude and a second pulse width. The different RESET program conditions, such as the first RESET program condition and the second RESET program condition, may be configured to generate different wave forms, such as the first waveform and the second waveform. The different RESET program conditions, such as the first RESET program condition and the second RESET program condition, may each be associated with a type of configuration change command. For example, the first RESET program condition may be associated with a SLC mode to MLC mode type configuration change command and the second RESET program condition may be associated with a MLC mode to SLC mode type configuration change command.

The different wave forms, such as the first waveform and the second waveform, may have different current amplitude values and/or different time durations. As one example, the first RESET program condition may be configured such that the first waveform has a first current amplitude with a higher current value than the second current amplitude of the second waveform generated by the second RESET program condition. In such an example, the time durations of the first waveform and the second waveform may be the same or different. As a specific example, the first RESET program condition with the higher current value may have a current value in a range of 750 microamps (μA) to 1.25 milliamps (mA), such as 750 μA, 750 μA to 1 mA, 1 mA, 1 mA to 1.25 mA, 1.25 mA, etc.; although lesser and greater currents may also be used; and the second RESET program condition with the lower current value may have a current value in a range of 250 μA to 750 μA, such as 250 μA, 250 μA to 500 μA, 500 μA, 500 μA to 750 μA, 750 μA, etc.; although lesser and greater currents may also be used. As another example, the first RESET program condition may be configured such that the first pulse width has a longer time duration than the second pulse width of the second waveform generated by the second RESET program condition. In such an example, the current values of the current amplitudes of the first waveform and the second waveform may be the same or different. As a specific example, the first RESET program condition with the first pulse with a longer time duration may have a time duration in a range of 20 nanoseconds (ns) to 400 ns, such as 20 ns, 20 ns to 200 ns, 200 ns, 200 ns to 400 ns, 400 ns, etc.; although lesser and greater time durations may also be used; and the second RESET program condition with the second pulse with the shorter time duration may have a time duration in a range of 20 ns to 200 ns, such as 20 ns, 20 ns to 100 ns, 100 ns, 100 ns to 200 ns, 200 ns, etc.; although lesser and greater time durations may also be used. As a further example, the first RESET program condition may be configured such that the first waveform has a first current amplitude with a higher current value than the second current amplitude of the second waveform generated by the second RESET program condition and the first pulse width has a longer time duration than the second pulse width of the second waveform generated by the second RESET program condition. As a specific example, the first RESET program condition with the higher current value and the longer time duration may have a current value in a range of 750 μA to 1.25 milliamps (mA), such as 750 μA, 750 μA to 1 mA, 1 mA, 1 mA to 1.25 mA, 1.25 mA, etc., and a time duration in a range of 20 ns to 400 ns, such as 20 ns, 20 ns to 200 ns, 200 ns, 200 ns to 400 ns, 400 ns, etc.; although lesser and greater currents and/or times may also be used; and the second RESET program condition with the lower current value and the shorter time duration may have a current value in a range of 250 μA to 750 μA, such as 250 μA, 250 μA to 500 μA, 500 μA, 500 μA to 750 μA, 750 μA, etc., and a time duration in a range of 20 ns to 200 ns, such as 20 ns, 20 ns to 100 ns, 100 ns, 100 ns to 200 ns, 200 ns, etc.; although lesser and greater currents may also be used.

Regardless of the configuration, in some embodiments, when comparing two RESET program conditions, such as the first RESET program condition and the second RESET program condition, the RESET program condition with a higher current value for the waveform generated by that RESET program condition may be considered to impart a stronger RESET than the other RESET program condition with the lower current value for the waveform generated by that other RESET program condition. The other RESET program condition with the lower current value for the waveform generated by that other RESET program condition may be considered to impart a weaker RESET in comparison to the RESET program condition with the higher current value for its generated waveform. As a specific example, when the plurality of RESET program conditions is a first RESET program condition with a higher current value for the waveform generated by the first RESET program condition (e.g., thereby imparting a stronger reset) and a second RESET program condition with a lower current value for the waveform generated by the second RESET program condition (e.g., thereby imparting a weaker reset), the current values of the first RESET program condition and the second RESET program condition may be correlated with one another such that the higher (e.g., stronger) current value is a fixed current value, such as a selected number of microamps (μA) or milliamps (mA), greater than the lower (e.g., weaker) current value. In this manner, a higher (e.g., stronger) current value may be determined by adding the fixed current value to the lower (e.g., weaker) current value when the lower (e.g., weaker) current value is known or the lower (e.g., weaker) current value may be determined by subtracting the fixed current value from the higher (e.g., stronger) current value when the higher (e.g., stronger) current value is known. In some embodiments, a RESET program condition, such as the first RESET program condition, having higher current value (e.g., imparting a stronger RESET) may be associated with a SLC mode to MLC mode type configuration change command and a RESET program condition, such as the second RESET program condition, having lower current value (e.g., imparting a weaker RESET) may be associated with a MLC mode to SLC mode type configuration change command.

In block 508, the memory circuit 400, 450 may program the PCRAM cell using the selected RESET program condition. For example, a memory controller, such as controller 401 of memory circuit 400, 450, may issue one or more program waveforms according to the selected RESET program condition. As a specific example, the controller 401 of memory circuit 400, 450 may transmit signals to the row decoder 402, column selector 403, and/or read/write driver 404 to cause the row decoder 402, column selector 403, and/or read/write driver 404 to generate one or more instances of the program waveform according to the selected RESET program condition, such as one or more instances of the first waveform generated by the first RESET program condition or one or more instances of the second waveform generated by the second RESET program condition.

Figure 5B:
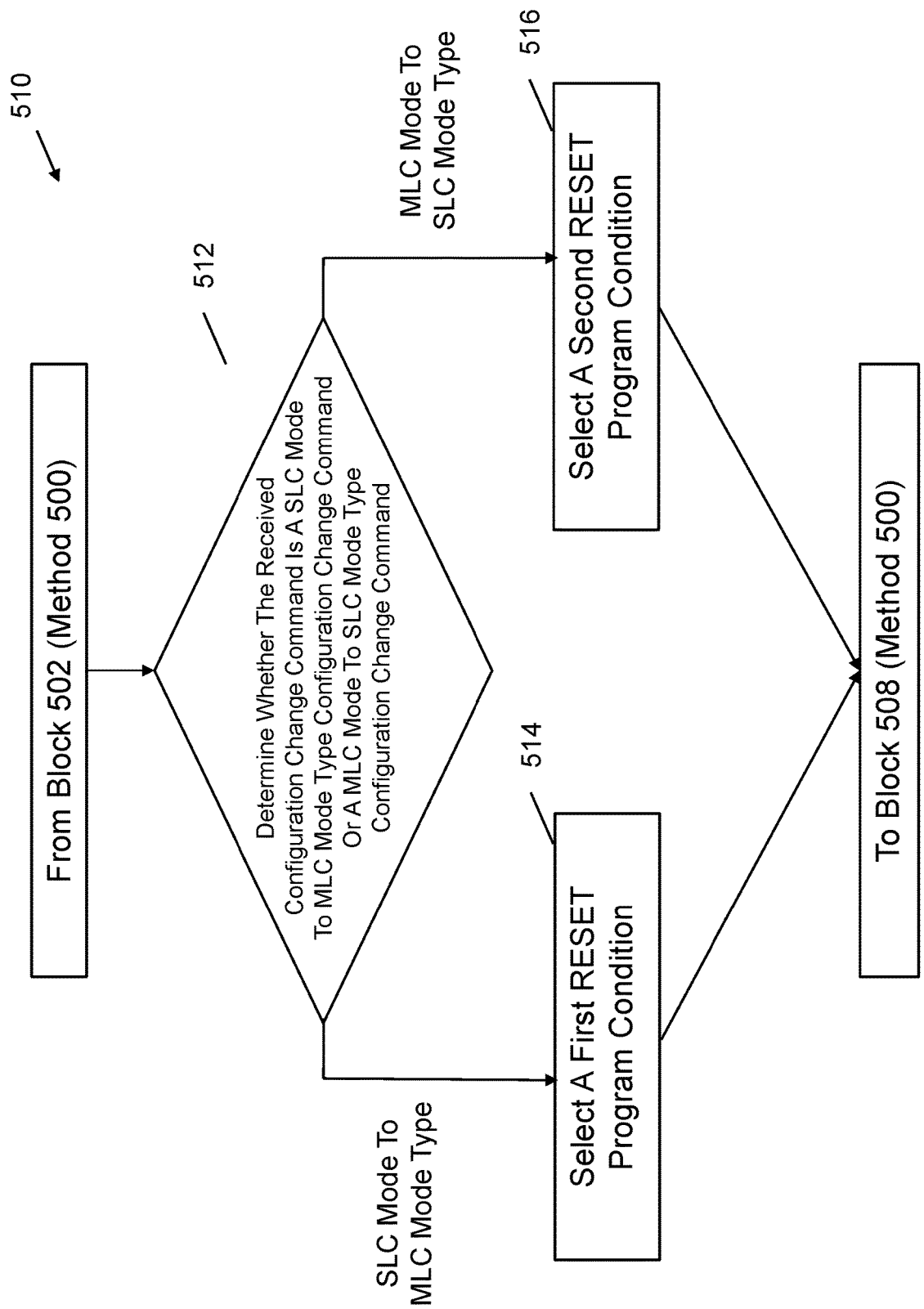
FIG. 5B is a process flow diagram illustrating a method for determining a type of a received configuration change command and selecting a RESET program condition, according to various embodiments of the present disclosure.

FIG. 5B is a process flow diagram illustrating a method 510 for determining a type of a received configuration change command and selecting a RESET program condition, according to various embodiments of the present disclosure. With reference to FIGS. 1-5B, in various embodiments, the operations of method 510 may be performed by a memory circuit, such as memory circuit 400, 450, including a PCRAM structure, such as PCRAM structure 10. The operations of method 510 may be performed as part of a method for configuring a PCRAM cell, such as a PCRAM cell 100 of a PCRAM structure 10, according to various embodiments of the present disclosure, such as part of the operations of method 500 (FIG. 5A). As a specific example, the operations of method 510 may be performed as part of the operations of blocks 504 and 506 of method 500 (FIG. 5A), such as in response to receiving a configuration change command associated with a PCRAM cell in block 502.

In block 512, the memory circuit 400, 450 may determine whether the received configuration change command is a SLC mode to MLC mode type configuration change command or a MLC mode to SLC mode type configuration change command. As an example, the type of configuration change command may be indicated in a received configuration change command itself, such as in an element of the configuration change command, by a value of the configuration change command, etc. As an example, the memory circuit 400, 450 may parse or otherwise read the received configuration change command and compare the attributes of the received configuration change command to stored indications of SLC mode to MLC mode type configuration change commands and MLC mode to SLC mode type configuration change commands. A match between the attributes of the received configuration change command and the stored indications may indicate the type of the received configuration change command, such as whether the received configuration change command is a SLC mode to MLC mode type configuration change command or a MLC mode to SLC mode type configuration change command.

In response to determining the received configuration change command is a SLC mode to MLC mode type configuration change command, in block 514, the memory circuit 400, 450 may select a first RESET program condition. In response to determining the received configuration change command is a MLC mode to SLC mode type configuration change command, in block 516, the memory circuit 400, 450 may select a second RESET program condition. As discussed with reference to block 506 of method 500 (FIG. 5A), in some embodiments, a RESET program condition, such as the first RESET program condition, having higher current value (e.g., imparting a stronger RESET) may be associated with a SLC mode to MLC mode type configuration change command and a RESET program condition, such as the second RESET program condition, having lower current value (e.g., imparting a weaker RESET) may be associated with a MLC mode to SLC mode type configuration change command. As one example, the association may be indicated by the storage location (e.g., a location in I/O buffer 405) of the RESET program conditions, with the first RESET program condition being stored in a location associated with SLC mode to MLC mode type configuration change commands and the second RESET program condition being stored in a location associated with MLC mode to SLC mode type configuration change commands. Based on determining the type of the received configuration change command, the corresponding RESET program condition may be selected (e.g., loaded, used, etc.).

In response to selecting the first RESET program condition in block 514 or selecting the second RESET program condition in block 516, the memory circuit 400, 450 may program the PCRAM cell using the selected RESET program condition in block 508 of method 500 (FIG. 5A) as described above.

Figure 6A:
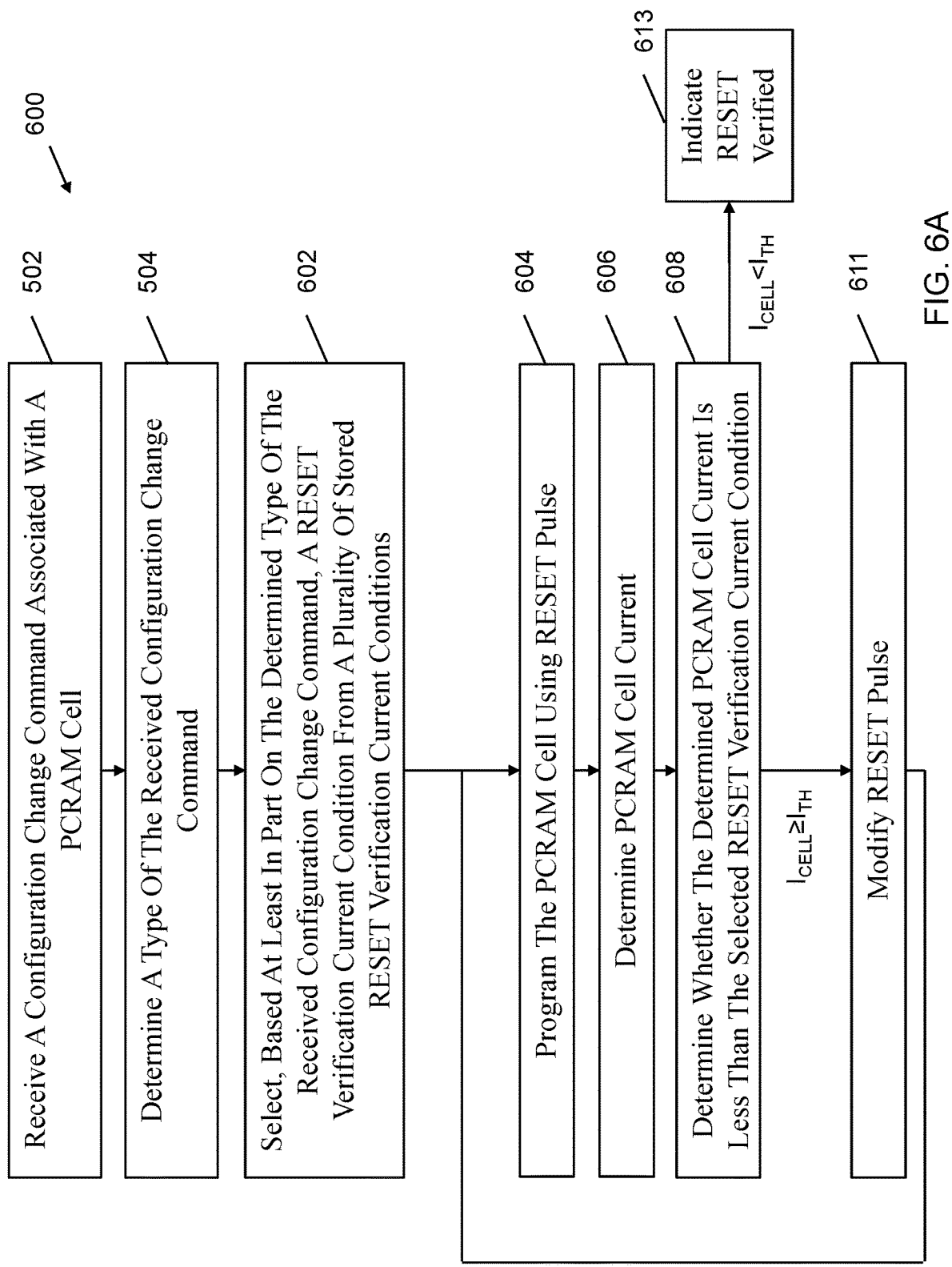
FIG. 6A is a process flow diagram illustrating a method for configuring a PCRAM cell, according to various embodiments of the present disclosure.

FIG. 6A is a process flow diagram illustrating a method 600 for configuring a PCRAM cell, such as a PCRAM cell 100 of a PCRAM structure 10, according to various embodiments of the present disclosure. With reference to FIGS. 1-6A, in various embodiments, the operations of method 600 may be performed by a memory circuit, such as memory circuit 400, 450, including a PCRAM structure, such as PCRAM structure 10. The operations of method 600 may be similar to the operations of methods 500 (FIG. 5A) and/or 510 (FIG. 5B) described above, except that rather than generating a one or more instances (e.g., one of more pulses) of a fixed amplitude and pulse width (e.g., the waveform of the selected RESET program condition) the operations of method 600 may provide an alternative approach in which a sequence of program and verify operations are performed using successively increasing strength (e.g., higher current amplitude and/or longer pulse width) instances of programming waveforms to program the PCRAM cell, such as a PCRAM cell 100 of a PCRAM structure 10.

In blocks 502 and 504, the memory circuit 400, 450 may perform operations of like numbered blocks of method 500 (FIG. 5A) to receive a configuration change command associated with a PCRAM cell and determine a type of the received configuration change command as discussed above.

In block 602, the memory circuit 400, 450 may select, based at least in part on the determined type of the received configuration change command, a RESET verification current condition from a plurality of stored RESET verification current conditions. In various embodiments, a plurality of different verification current conditions may be associated with different types of configuration change commands. For example, buffers or other storage devices, such as I/O buffers 405, may store a plurality of different verification current conditions, each associated with different types of configuration change commands. As a specific example, one location may store a RESET verification current condition associated with a MLC mode to SLC mode type configuration change command and another location may store a RESET verification current condition associated with a SLC mode to MLC mode type configuration change command. In various embodiments, the RESET verification current conditions may be cell current value thresholds (e.g., $I_{TH}$) configured such that the PCRAM cell current (e.g., $I_{cell}$) may be below the cell current value thresholds (e.g., $I_{TH}$) when the PCRAM cell, such as a PCRAM cell 100 of a PCRAM structure 10, is successfully RESET. As a specific example, a cell current value threshold (e.g., $I_{TH}$) may have a current value in a range of 0.01 µA to 0.2 µA, such as 0.01 µA, 0.01 µA to 0.1 µA, 0.1 µA, 0.1 µA to 0.2 µA, 0.2 µA, etc.; although lesser and greater currents may also be used.

As a specific example, the plurality of RESET verification current conditions may be at least two RESET verification current conditions, such as a first RESET verification current condition and a second RESET verification current condition. The different RESET verification current conditions, such as the first RESET verification current condition and the second RESET verification current condition, may each be associated with a type of configuration change command. For example, the first RESET verification current condition may be associated with a SLC mode to MLC mode type configuration change command and the second RESET verification current condition may be associated with a MLC mode to SLC mode type configuration change command.

The different RESET verification current conditions, such as the first RESET verification current condition and the second RESET verification current condition, may each be different current value thresholds (e.g., $I_{TH}$). The current value thresholds (e.g., $I_{TH}$) may be current values, such as a selected number of microamps (µA) or milliamps (mA), that the cell current (e.g., $I_{cell}$) should be below to indicate that the PCRAM cell, such as a PCRAM cell 100 of a PCRAM structure 10, was successfully RESET. In some embodiments, when comparing two RESET verification current conditions, such as the first RESET verification current condition and the second RESET verification current condition, the RESET verification current condition that is the lower current value threshold (e.g., $I_{TH}$) may be considered to be associated with a stronger RESET of the PCRAM cell, such as a PCRAM cell 100 of a PCRAM structure 10, than the other RESET verification condition with the higher current value threshold (e.g., $I_{TH}$). The other RESET verification current condition with the higher current value threshold (e.g., $I_{TH}$) may be considered to be associated with a weaker RESET of the PCRAM cell, such as a PCRAM cell 100 of a PCRAM structure 10, in comparison to the RESET verification current condition with the lower current value threshold (e.g., $I_{TH}$). In some embodiments, a RESET verification current condition, such as the first RESET verification current condition, having lower current value threshold (e.g., $I_{TH}$) may be associated with a SLC mode to MLC mode type configuration change command and a RESET verification current condition, such as the second RESET verification current condition, having higher current value (e.g. $I_{TH}$) may be associated with a MLC mode to SLC mode type configuration change command.

In block 604, the memory circuit 400, 450 may program the PCRAM cell using a RESET pulse. For example, a memory controller, such as controller 401 of memory circuit 400, 450, may issue an initial (or default) program waveform. As a specific example, the controller 401 of memory circuit 400, 450 may transmit signals to the row decoder 402, column selector 403, and/or read/write driver 404 to cause the row decoder 402, column selector 403, and/or read/write driver 404 to generate an initial (or default) program waveform.

In block 606, the memory circuit 400, 450 may determine a PCRAM cell current. For example, the controller 401 of the memory circuit 400, 450 may control a current sensing circuit (e.g., current sensing circuit 406) to sense the current of the PCRAM cell (e.g., $I_{cell}$) when a selected read voltage (e.g., $V_{read}$) is applied to the PCRAM cell 100. The controller 401 of the memory circuit 400, 450 may store the determined current (e.g., $I_{cell}$) in a buffer, such as I/O buffer 405.

In block 608, the memory circuit 400, 450 may determine whether the determined PCRAM cell current is less than the selected RESET verification current condition. For example, the controller 401 of the memory circuit 400, 450 may compare the determined current of the PCRAM cell (e.g., $I_{cell}$) to the current value threshold (e.g., $I_{TH}$) of the selected RESET verification current condition, such as the first RESET verification current condition or the second RESET verification current condition, to determine whether the determined PCRAM cell current (e.g., $I_{cell}$) is less than the selected RESET verification current condition (e.g., $I_{TH}$). Comparing the determined current of the PCRAM cell (e.g., $I_{cell}$) to the current value threshold (e.g., $I_{TH}$) of the selected RESET verification current condition may be done in any manner, such as by subtracting the determined current of the PCRAM cell ($I_{cell}$) from the current value threshold (e.g., $I_{TH}$) of the selected RESET verification current condition and determining that a non-zero positive result indicates the determined PCRAM cell current (e.g., $I_{cell}$) is less than the selected RESET verification current condition (e.g., $I_{TH}$) and a zero or negative result indicates the determined PCRAM cell current (e.g., Len) is greater than the selected RESET verification current condition (e.g., $I_{TH}$). Comparing the determined current of the PCRAM cell (e.g., $I_{cell}$) to the current value threshold (e.g., $I_{TH}$) of the selected RESET verification current condition may enable the controller 401 of the memory circuit 400, 450 to determine whether or not the determined PCRAM cell current meets the selected RESET verification current condition. The determined PCRAM cell current (e.g., $I_{cell}$) being less than the selected RESET verification current condition (e.g., $I_{TH}$) (i.e., that $I_{cell} < I_{Th}$) may indicate to the controller 401 of the memory circuit 400, 450 that the determined PCRAM cell current (e.g., $I_{cell}$) meets the selected RESET verification current condition (e.g., $I_{TH}$). The determined PCRAM cell current (e.g., $I_{cell}$) not being less than the selected RESET verification current condition (e.g., $I_{TH}$) (i.e., that $I_{cell} \geq I_{Th}$) may indicate to the controller 401 of the memory circuit 400, 450 that the determined PCRAM cell current (e.g., $I_{cell}$) does not meet the selected RESET verification current condition (e.g., $I_{TH}$).

In response to determining that the determined PCRAM cell current (e.g., $I_{cell}$) is less than the selected RESET verification current condition (e.g., $I_{TH}$) (i.e., that $I_{cell} < I_{Th}$) the memory circuit 400, 450 may indicate the RESET is verified in block 613.

In response to determining that the determined PCRAM cell current (e.g., $I_{cell}$) is not less than the selected RESET verification current condition (e.g., $I_{TH}$) (i.e., that $I_{cell} \geq I_{Th}$) the memory circuit 400, 450 may modify the RESET pulse in block 611. Modifying the RESET pulse may include increasing the current amplitude and/or pulse width of the RESET pulse used for programming in block 604. As one example, the memory circuit 400, 450 may modify the RESET pulse to have a higher value current amplitude than the last RESET pulse used for programming the PCRAM cell, such as a PCRAM cell 100 of a PCRAM structure 10. The pulse width of the modified RESET pulse may be same or different than that of the last RESET pulse used for programming the PCRAM cell, such as a PCRAM cell 100 of a PCRAM structure 10. As another example, the memory circuit 400, 450 may modify the RESET pulse to have a longer time duration pulse width than the last RESET pulse used for programming the PCRAM cell, such as a PCRAM cell 100 of a PCRAM structure 10. The current amplitude of the modified RESET pulse may be same or different than that of the last RESET pulse used for programming the PCRAM cell, such as a PCRAM cell 100 of a PCRAM structure 10. As a further example, the memory circuit 400, 450 may modify the RESET pulse to have a higher current amplitude and a longer time duration pulse width than those of the last RESET pulse used for programming the PCRAM cell, such as a PCRAM cell 100 of a PCRAM structure 10. In this manner, by modifying the current amplitude and/or pulse width of the RESET pulse, the RESET pulse may be sequentially changed, such as sequentially strengthened, to modify the RESET of the PCRAM cell, such as strengthen the RESET of the PCRAM cell until the determined PCRAM cell current (e.g., $I_{cell}$) is below the selected RESET verification current condition (e.g., $I_{TH}$) (i.e., that $I_{cell} < I_{Th}$).

In response to modifying the RESET pulse, the memory circuit 400, 450 may program the PCRAM cell using a RESET pulse, i.e., the now modified RESET pulse, in block 604. For example, a memory controller, such as controller 401 of memory circuit 400, 450, may issue a program waveform according to the modified RESET pulse. As a specific example, the controller 401 of memory circuit 400, 450 may transmit signals to the row decoder 402, column selector 403, and/or read/write driver 404 to cause the row decoder 402, column selector 403, and/or read/write driver 404 to generate a program waveform having the modified current amplitude and/or pulse width duration as modified in block 611. As discussed above, in response to determining that the determined PCRAM cell current (e.g., $I_{cell}$) is less than the selected RESET verification current condition (e.g., $I_{TH}$) (i.e., that $I_{cell} < I_{Th}$) the memory circuit 400, 450 may indicate the RESET is verified in block 613 (i.e., the selected RESET verification current condition (e.g., $I_{TH}$) is met) and in response to determining that the determined PCRAM cell current (e.g., $I_{cell}$) is not less than the selected RESET verification current condition (e.g., $I_{TH}$) (i.e., that $I_{cell} \geq I_{Th}$) the memory circuit 400, 450 may again modify the RESET pulse in block 611. In this manner, by repeatedly performing the operations of blocks 611, 604, 606, and 608, the memory circuit 400, 450 may successively modify the RESET pulse (e.g., strength the RESET pulse) until the PCRAM cell current (e.g., $I_{cell}$) is determined to be less than the selected RESET verification current condition (e.g., $I_{TH}$) (i.e., until $I_{cell} < I_{Th}$ and the selected RESET verification current condition is met).

Figure 6B:
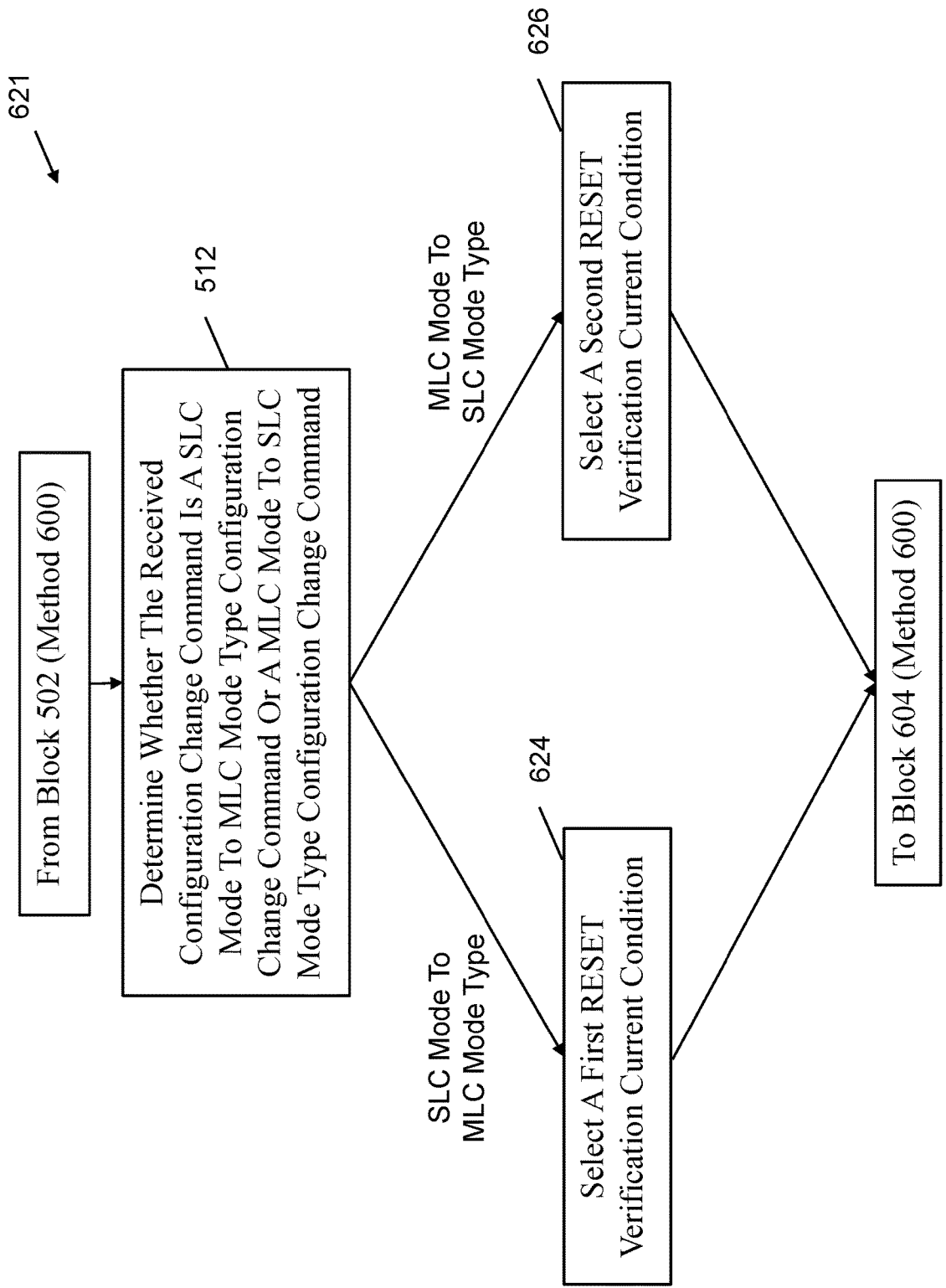
FIG. 6B is a process flow diagram illustrating a method for determining a type of a received configuration change command and selecting a RESET verification current condition, according to various embodiments of the present disclosure

FIG. 6B is a process flow diagram illustrating a method 621 for determining a type of a received configuration change command and selecting a RESET verification current condition, according to various embodiments of the present disclosure. With reference to FIGS. 1-6B, in various embodiments, the operations of method 621 may be performed by a memory circuit, such as memory circuit 400, 450, including a PCRAM structure, such as PCRAM structure 10. The operations of method 621 may be performed as part of a method for configuring a PCRAM cell, such as a PCRAM cell 100 of a PCRAM structure 10, according to various embodiments of the present disclosure, such as part of the operations of method 600 (FIG. 6A). As a specific example, the operations of method 621 may be performed as part of the operations of blocks 504 and 602 of method 600 (FIG. 6A), such as in response to receiving a configuration change command associated with a PCRAM cell in block 502.

As discussed above, in block 512, the memory circuit 400, 450 may determine whether the received configuration change command is a SLC mode to MLC mode type configuration change command or a MLC mode to SLC mode type configuration change command.

In response to determining the received configuration change command is a SLC mode to MLC mode type configuration change command, in block 624, the memory circuit 400, 450 may select a first RESET verification current condition. In response to determining the received configuration change command is a MLC mode to SLC mode type configuration change command, in block 626, the memory circuit 400, 450 may select a second RESET verification current condition. As discussed with reference to block 602 of method 600 (FIG. 6A), in some embodiments, a RESET verification condition, such as the first RESET verification current condition having a lower current value threshold (e.g., $I_{TH}$), may be considered to be associated with a stronger RESET and may be associated with a SLC mode to MLC mode type configuration change command. In contrast, a RESET verification condition, such as the second RESET verification current condition having a higher current value threshold (e.g., $I_{TH}$), may be considered to be associated with a weaker RESET and may be associated with a MLC mode to SLC mode type configuration change command. As one example, the association may be indicated by the storage location (e.g., a location in I/O buffer 405) of the RESET verification conditions, with the first RESET verification condition being stored in a location associated with SLC mode to MLC mode type configuration change commands and the second RESET verification condition being stored in a location associated with MLC mode to SLC mode type configuration change commands. Based on determining the type of the received configuration change command, the corresponding RESET verification condition may be selected (e.g., loaded, used, etc.).

In response to selecting the first RESET verification condition in block 624 or selecting the second RESET verification condition in block 626, the memory circuit 400, 450 may program the PCRAM cell using the RESET program condition in block 604 of method 600 (FIG. 6A) as described above.

Figure 6C:
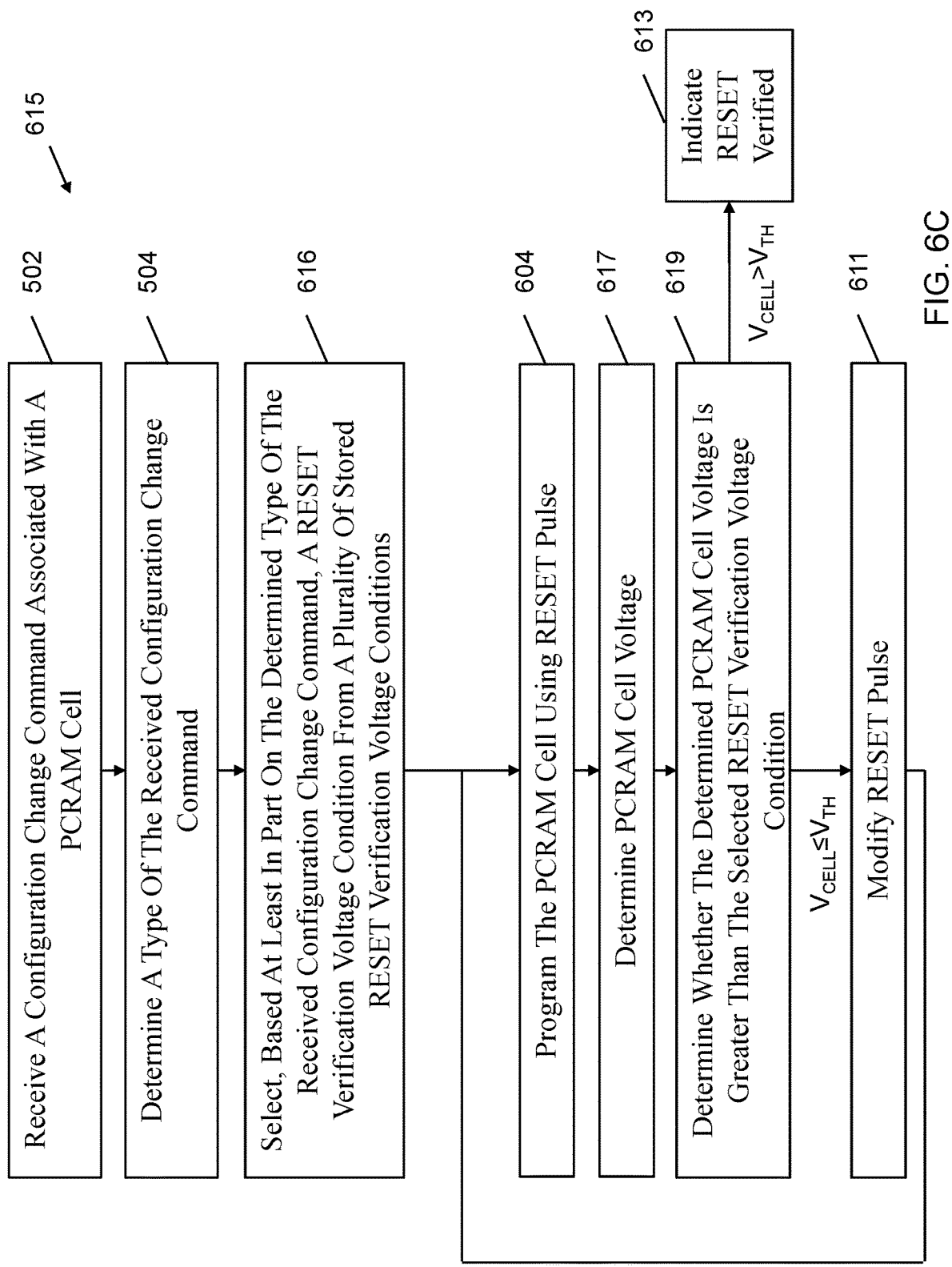
FIG. 6C is a process flow diagram illustrating a method for configuring a PCRAM cell, according to various embodiments of the present disclosure.

FIG. 6C is a process flow diagram illustrating a method 615 for configuring a PCRAM cell, such as a PCRAM cell 100 of a PCRAM structure 10, according to various embodiments of the present disclosure. With reference to FIGS. 1-6C, in various embodiments, the operations of method 615 may be performed by a memory circuit, such as memory circuit 400, 450, including a PCRAM structure, such as PCRAM structure 10. The operations of method 615 may be similar to the operations of methods 500 (FIG. 5A), 510 (FIG. 5B), 600 (FIG. 6A), and/or 621 (FIG. 6B) described above, except that rather than verification based on PCRAM cell current, the operations of method 615 may provide an alternative approach in which PCRAM cell voltage and RESET verification voltage conditions may be used to verify the successful RESET of the PCRAM cell, such as a PCRAM cell 100 of a PCRAM structure 10.

In blocks 502 and 504, the memory circuit 400, 450 may perform operations of like numbered blocks of method 500 (FIG. 5A) to receive a configuration change command associated with a PCRAM cell and determine a type of the received configuration change command as discussed above.

In block 616, the memory circuit 400, 450 may select, based at least in part on the determined type of the received configuration change command, a RESET verification voltage condition from a plurality of stored RESET verification voltage conditions. In various embodiments, a plurality of different verification voltage conditions may be associated with different types of configuration change commands. For example, buffers or other storage devices, such as I/O buffers 405, may store a plurality of different verification voltage conditions, each associated with different types of configuration change commands. As a specific example, one location may store a RESET verification voltage condition associated with a MLC mode to SLC mode type configuration change command and another location may store a RESET verification voltage condition associated with a SLC mode to MLC mode type configuration change command. In various embodiments, the RESET verification voltage conditions may be cell voltage value thresholds (e.g., $V_{TH}$) configured such that the PCRAM cell voltage (e.g., $V_{cell}$) may be above the cell voltage value thresholds (e.g., $V_{TH}$) when the PCRAM cell, such as a PCRAM cell 100 of a PCRAM structure 10, is successfully RESET. As a specific example, a cell voltage value threshold (e.g., $V_{TH}$) may have a voltage value in a range of 0.5 V to 1.5 V, such as 0.5 V, 0.5 V to 1.0 V, 1.0 V, 1.0 V to 1.5 V, 1.5 V, etc.; although lesser and greater voltages may also be used.

As a specific example, the plurality of RESET verification voltage conditions may be at least two RESET verification voltage conditions, such as a first RESET verification voltage condition and a second RESET verification voltage condition. The different RESET verification voltage conditions, such as the first RESET verification voltage condition and the second RESET verification voltage condition, may each be associated with a type of configuration change command. For example, the first RESET verification current condition may be associated with a SLC mode to MLC mode type configuration change command and the second RESET verification current condition may be associated with a MLC mode to SLC mode type configuration change command.

The different RESET verification voltage conditions, such as the first RESET verification voltage condition and the second RESET verification voltage condition, may each be different voltage value thresholds (e.g., $V_{TH}$). The voltage value thresholds (e.g., $V_{TH}$) may be voltage values, such as a selected number of volts (V), that the cell voltage (e.g., $V_{Cell}$) should be above to indicate that the PCRAM cell, such as a PCRAM cell 100 of a PCRAM structure 10, was successfully RESET. In some embodiments, when comparing two RESET verification voltage conditions, such as the first RESET verification voltage condition and the second RESET verification voltage condition, the RESET verification voltage condition that is the higher voltage value threshold (e.g., $V_{TH}$) may be considered to be associated with a stronger RESET of the PCRAM cell, such as a PCRAM cell 100 of a PCRAM structure 10, than the other RESET verification voltage with the lower voltage value threshold (e.g., $V_{TH}$). The other RESET verification voltage condition with the lower voltage value threshold (e.g., $V_{TH}$) may be considered to be associated with a weaker RESET of the PCRAM cell, such as a PCRAM cell 100 of a PCRAM structure 10, in comparison to the RESET verification voltage condition with the higher voltage value threshold (e.g., $V_{TH}$). In some embodiments, a RESET verification voltage condition, such as the first RESET verification voltage condition, having a higher voltage value threshold (e.g., $V_{TH}$) may be associated with a SLC mode to MLC mode type configuration change command and a RESET verification voltage condition, such as the second RESET verification voltage condition, having a lower voltage value (e.g., $V_{TH}$) may be associated with a MLC mode to SLC mode type configuration change command.

In block 604, the memory circuit 400, 450 may perform operations of like numbered block of method 600 (FIG. 6A) to program the PCRAM cell using a RESET pulse as discussed above.

In block 617, the memory circuit 400, 450 may determine a PCRAM cell voltage. For example, the controller 401 of the memory circuit 400, 450 may control a voltage sensing circuit (e.g., voltage sensing circuit 407) to sense the voltage of the PCRAM cell (e.g., $V_{cell}$) when a selected read current (e.g., $I_{read}$) is applied to the PCRAM cell 100. The controller 401 of the memory circuit 400, 450 may store the determined voltage (e.g., $V_{cell}$) in a buffer, such as I/O buffer 405.

In block 619, the memory circuit 400, 450 may determine whether the determined PCRAM cell voltage is greater than the selected RESET verification voltage condition. For example, the controller 401 of the memory circuit 400, 450 may compare the determined voltage of the PCRAM cell (e.g., $V_{cell}$) to the voltage value threshold (e.g., $V_{TH}$) of the selected RESET verification voltage condition, such as the first RESET verification voltage condition or the second RESET verification voltage condition, to determine whether the determined PCRAM cell voltage (e.g., $V_{cell}$) is greater than the selected RESET verification voltage condition (e.g., $V_{TH}$). Comparing the determined voltage of the PCRAM cell (e.g., $V_{cell}$) to the voltage value threshold (e.g., $V_{TH}$) of the selected RESET verification voltage condition may be done in any manner, such as by subtracting the voltage value threshold (e.g., $V_{TH}$) of the selected RESET verification voltage condition from the determined voltage of the PCRAM cell ($V_{cell}$) and determining that a non-zero positive result indicates the determined PCRAM cell voltage (e.g., $V_{cell}$) is greater than the selected RESET verification voltage condition (e.g., $V_{TH}$) and a zero or negative result indicates the determined PCRAM cell voltage (e.g., $V_{cell}$) is less than or equal to the selected RESET verification voltage condition (e.g., $V_{TH}$). Comparing the determined voltage of the PCRAM cell (e.g., $V_{cell}$) to the voltage value threshold (e.g., $V_{TH}$) of the selected RESET verification voltage condition may enable the controller 401 of the memory circuit 400, 450 to determine whether or not the determined PCRAM cell voltage meets the selected RESET verification voltage condition. The determined PCRAM cell voltage (e.g., $V_{cell}$) being greater than the selected RESET verification voltage condition (e.g., $V_{TH}$) (i.e., that $V_{cell} > V_{Th}$) may indicate to the controller 401 of the memory circuit 400, 450 that the determined PCRAM cell voltage (e.g., $V_{cell}$) meets the selected RESET verification voltage condition (e.g., $V_{TH}$). The determined PCRAM cell voltage (e.g., $V_{cell}$) not being greater than the selected RESET verification voltage condition (e.g., $V_{TH}$) (i.e., that $V_{cell} \leq V_{Th}$) may indicate to the controller 401 of the memory circuit 400, 450 that the determined PCRAM cell voltage (e.g., $V_{cell}$) does not meet the selected RESET verification voltage condition (e.g., $V_{TH}$).

In response to determining that the determined PCRAM cell voltage (e.g., $V_{cell}$) is greater than the selected RESET verification voltage condition (e.g., $V_{TH}$) (i.e., that $V_{cell} > V_{Th}$) the memory circuit 400, 450 may, in block 613, perform operations of like numbered block of method 600 (FIG. 6A) to indicate the RESET is verified as discussed above.

In response to determining that the determined PCRAM cell voltage (e.g., $V_{cell}$) is not greater than the selected RESET verification voltage condition (e.g., $V_{TH}$) (i.e., that $V_{cell} \leq V_{Th}$) the memory circuit 400, 450 may, in block 611, perform operations of like numbered block of method 600 (FIG. 6A) to modify the RESET pulse.

In response to modifying the RESET pulse, the memory circuit 400, 450 may program the PCRAM cell using a RESET pulse, i.e., the now modified RESET pulse, in block 604. For example, a memory controller, such as controller 401 of memory circuit 400, 450, may issue a program waveform according to the modified RESET pulse. As a specific example, the controller 401 of memory circuit 400, 450 may transmit signals to the row decoder 402, column selector 403, and/or read/write driver 404 to cause the row decoder 402, column selector 403, and/or read/write driver 404 to generate a program waveform having the modified current amplitude and/or pulse width duration as modified in block 611. As discussed above, in response to determining that the determined PCRAM cell voltage (e.g., $V_{cell}$) is greater than the selected RESET verification voltage condition (e.g., $V_{TH}$) (i.e., that $V_{cell} > V_{Th}$) the memory circuit 400, 450 may indicate the RESET is verified in block 613 (i.e., the selected RESET verification voltage condition (e.g., $V_{TH}$) is met) and in response to determining that the determined PCRAM cell voltage (e.g., $V_{cell}$) is not greater than the selected RESET verification voltage condition (e.g., $V_{TH}$) (i.e., that $V_{cell} \leq V_{Th}$) the memory circuit 400, 450 may again modify the RESET pulse in block 611. In this manner, by repeatedly performing the operations of blocks 611, 604, 617, and 619, the memory circuit 400, 450 may successively modify the RESET pulse (e.g., strength the RESET pulse) until the PCRAM cell voltage (e.g., $V_{cell}$) is determined to be greater than the selected RESET verification voltage condition (e.g., $V_{TH}$) (i.e., until $V_{cell} > V_{Th}$ and the selected RESET verification voltage condition is met).

Figure 6D:
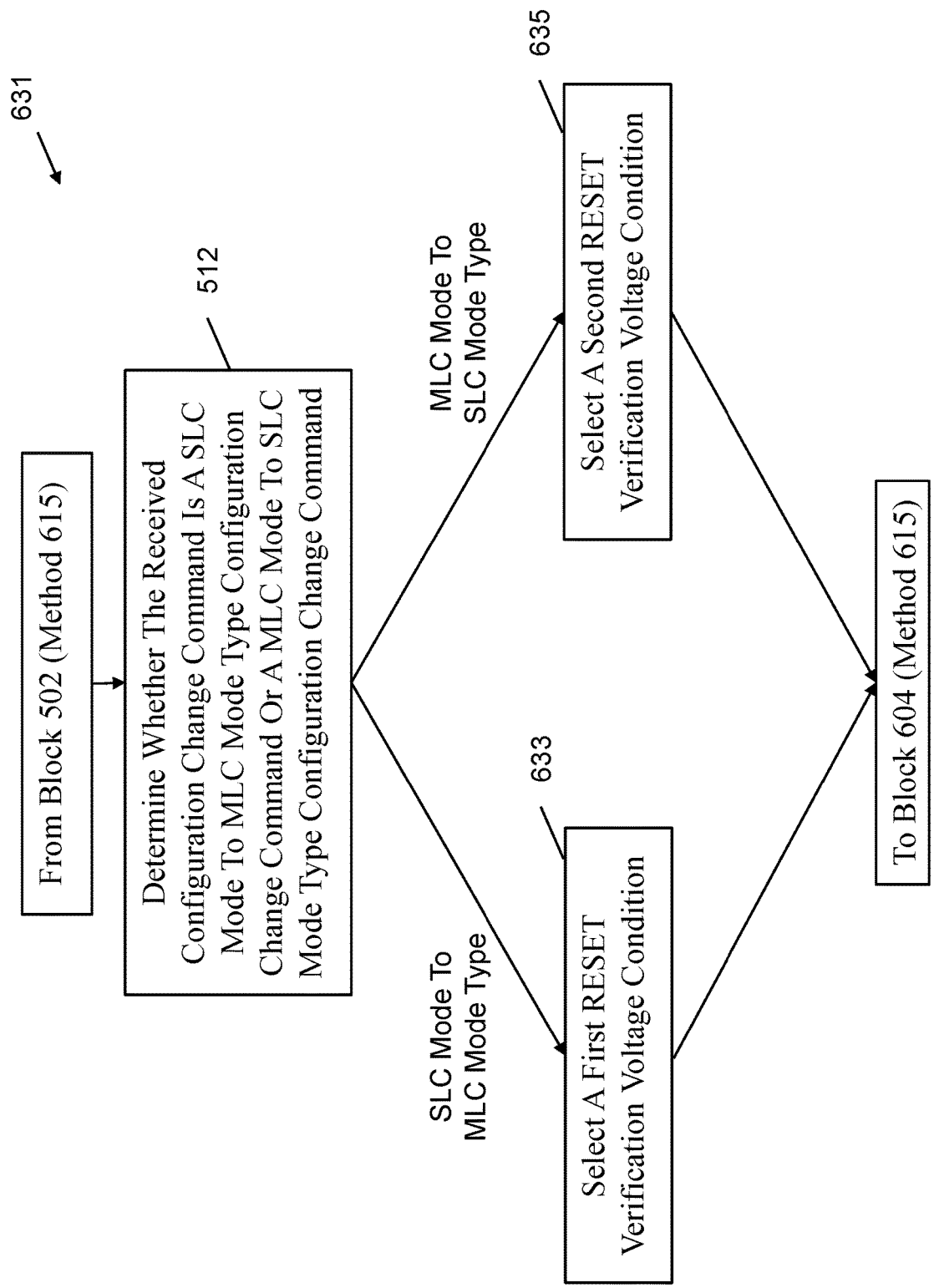
FIG. 6D is a process flow diagram illustrating a method for determining a type of a received configuration change command and selecting a RESET verification voltage condition, according to various embodiments of the present disclosure.

FIG. 6D is a process flow diagram illustrating a method 631 for determining a type of a received configuration change command and selecting a RESET verification voltage condition, according to various embodiments of the present disclosure. With reference to FIGS. 1-6D, in various embodiments, the operations of method 631 may be performed by a memory circuit, such as memory circuit 400, 450, including a PCRAM structure, such as PCRAM structure 10. The operations of method 631 may be performed as part of a method for configuring a PCRAM cell, such as a PCRAM cell 100 of a PCRAM structure 10, according to various embodiments of the present disclosure, such as part of the operations of method 615 (FIG. 6C). As a specific example, the operations of method 631 may be performed as part of the operations of blocks 504 and 616 of method 615 (FIG. 6C), such as in response to receiving a configuration change command associated with a PCRAM cell in block 502.

As discussed above, in block 512, the memory circuit 400, 450 may determine whether the received configuration change command is a SLC mode to MLC mode type configuration change command or a MLC mode to SLC mode type configuration change command.

In response to determining the received configuration change command is a SLC mode to MLC mode type configuration change command, in block 633, the memory circuit 400, 450 may select a first RESET verification voltage condition. In response to determining the received configuration change command is a MLC mode to SLC mode type configuration change command, in block 635, the memory circuit 400, 450 may select a second RESET verification voltage condition. As discussed with reference to block 616 of method 615 (FIG. 6C), in some embodiments, a RESET verification condition, such as the first RESET verification voltage condition having a higher voltage value threshold (e.g., $V_{TH}$), may be considered to be associated with a stronger RESET and may be associated with a SLC mode to MLC mode type configuration change command. In contrast, a RESET verification condition, such as the second RESET verification voltage condition having a lower voltage value threshold (e.g., $V_{TH}$), may be considered to be associated with a weaker RESET and may be associated with a MLC mode to SLC mode type configuration change command. As one example, the association may be indicated by the storage location (e.g., a location in I/O buffer 405) of the RESET verification conditions, with the first RESET verification condition being stored in a location associated with SLC mode to MLC mode type configuration change commands and the second RESET verification condition being stored in a location associated with MLC mode to SLC mode type configuration change commands. Based on determining the type of the received configuration change command, the corresponding RESET verification condition may be selected (e.g., loaded, used, etc.).

In response to selecting the first RESET verification condition in block 633 or selecting the second RESET verification condition in block 635, the memory circuit 400, 450 may program the PCRAM cell using the RESET program condition in block 604 of method 615 (FIG. 6C) as described above.

Figure 7A:
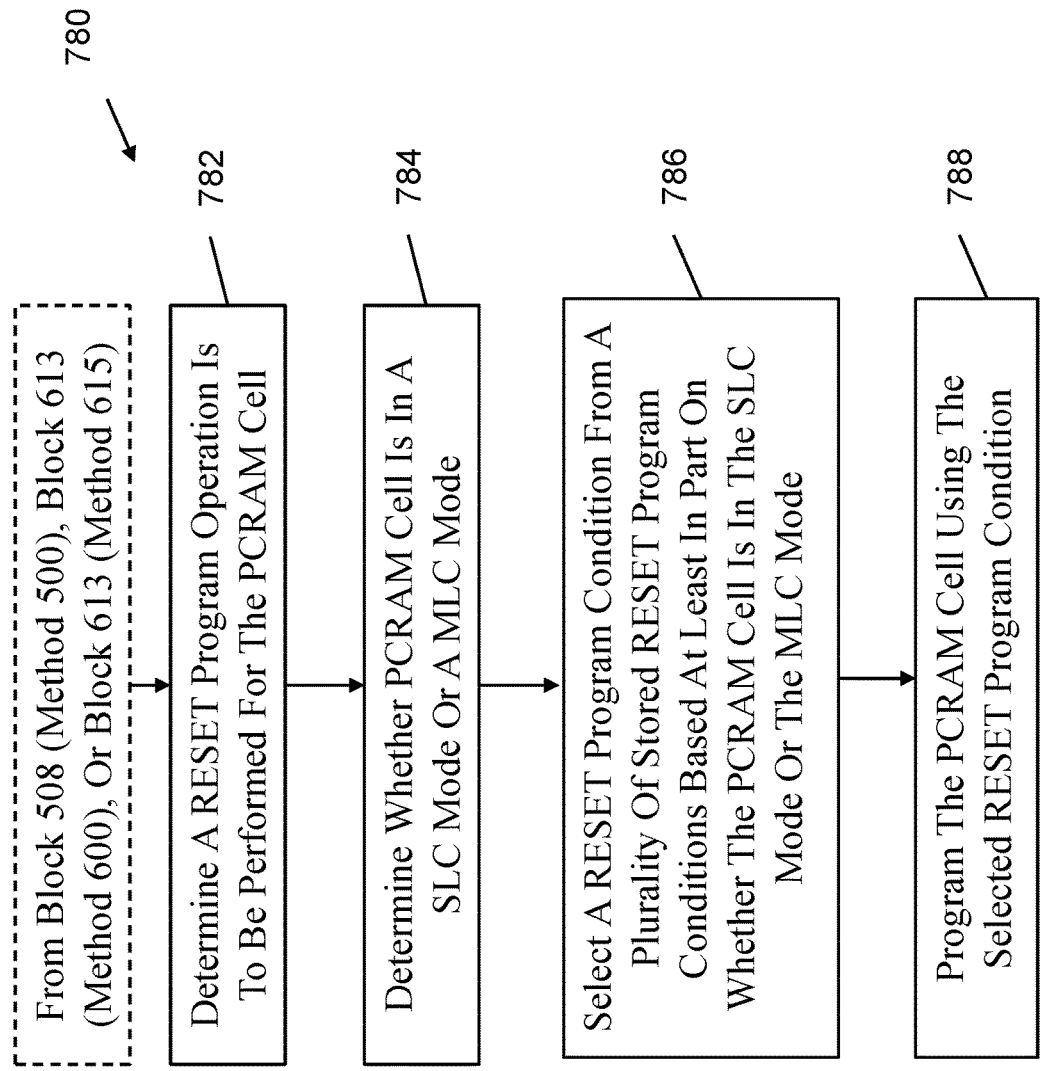
FIG. 7A is a process flow diagram illustrating a method for configuring a PCRAM cell, according to various embodiments of the present disclosure.

FIG. 7A is a process flow diagram illustrating a method 780 for configuring a PCRAM cell, such as a PCRAM cell 100 of a PCRAM structure 10, according to various embodiments of the present disclosure. With reference to FIGS. 1-7A, in various embodiments, the operations of method 780 may be performed by a memory circuit, such as memory circuit 400, 450, including a PCRAM structure, such as PCRAM structure 10. In some embodiments, the operations of method 780 may be performed in conjunction with the operations of methods 500 (FIG. 5A), 510 (FIG. 5B), 600 (FIG. 6A), 621 (FIG. 6B), 615 (FIG. 6C), and/or 631 (FIG. 6D) described above. For example, the operations of method 780 may be performed in response to programming the PCRAM cell successfully in block 508 of method 500 (FIG. 5A), block 613 of method 600 (FIG. 6A), or block 613 of method 615 (FIG. 6C). In some embodiments, the operations of method 780 may be performed independent of the method used to program the PCRAM cell.

In block 782, the memory circuit 400, 450 may determine a RESET program operation is to be performed for the PCRAM cell. In some embodiments, a host device, such as a host controller or processor, may issue a RESET command to a memory controller, such as controller 401 of memory circuit 400, 450, to cause the memory controller to perform a RESET program operation for a memory structure, such as a PCRAM cell 100 of a PCRAM structure 10 that is part of a memory structure 20 having a plurality of PCRAM cells 100 (e.g., an array of PCRAM cells 100).

In block 784, the memory circuit 400, 450 may determine whether the PCRAM cell is in a SLC mode or a MLC mode. For example, the controller 401 of memory circuit 400, 450 may store an indication, such as a flag setting in the I/O buffer 405, indicating whether the last RESET program operation transitioned from SLC to MLC or MLC to SLC. As another example, the controller 401 of memory circuit 400, 450 may store an indication, such as a flag setting in the I/O buffer 405, indicating the current mode, such as SLC or MLC, of a PCRAM cell, such as a PCRAM cell 100 of a PCRAM structure 10. By reading the status of the indication, the controller 401 of memory circuit 400, 450 may determine the state of the PCRAM cell as in a SLC mode or a MLC mode.

In block 786, the memory circuit 400, 450 may select a RESET program condition from a plurality of stored RESET program conditions based at least in part on whether the PCRAM cell is in the SLC mode or the MLC mode. In various embodiments, a plurality of different RESET program conditions may be associated with different modes of operation of a PCRAM cell, such as SLC modes and MLC modes. For example, buffers or other storage devices, such as I/O buffers 405, may store a plurality of different RESET program conditions, each associated with different modes of operation of a PCRAM cell, such as SLC modes and MLC modes. As a specific example, one location may store a RESET program condition associated with a MLC mode and another location may store a RESET program condition associated with a SLC mode.

As discussed above with reference to block 506 of method 500 (FIG. 5A), in various embodiments, the RESET program conditions may be configured such that when selected and used (e.g., loaded, accessed, etc.), a RESET program condition causes a memory controller, such as controller 401 of memory circuit 400, 450, to generate a waveform having a current amplitude of a current value indicated by the RESET program condition and/or a pulse width indicated by the RESET program condition. As a specific example, the plurality of RESET program conditions may be at least two RESET program conditions, such as a first RESET program condition configured to generate a first waveform having a first current amplitude and a first pulse width and a second RESET program condition configured to generate a second waveform having a second current amplitude and a second pulse width. The different RESET program conditions, such as the first RESET program condition and the second RESET program condition, may be configured to generate different wave forms, such as the first waveform and the second waveform.

In some embodiments, the different RESET program conditions, such as the first RESET program condition and the second RESET program condition, may each be associated with a different mode of the PCRAM cell. For example, the first RESET program condition may be associated with a MLC mode and the second RESET program condition may be associated with a SLC mode.

As discussed above with reference to block 506 of method 500 (FIG. 5A), the different wave forms, such as the first waveform and the second waveform, may have different current amplitude values and/or different time durations. As discussed above with reference to block 506 of method 500 (FIG. 5A), regardless of the configuration, in some embodiments, when comparing two RESET program conditions, such as the first RESET program condition and the second RESET program condition, the RESET program condition with a higher current value for the waveform generated by that RESET program condition may be considered to impart a stronger RESET than the other RESET program condition with the lower current value for the waveform generated by that other RESET program condition.

In some embodiments, a RESET program condition, such as the first RESET program condition, having higher current value (e.g., imparting a stronger RESET) may be associated with a MLC mode and a RESET program condition, such as the second RESET program condition, having lower current value (e.g., imparting a weaker RESET) may be associated with a SLC mode In block 788, the memory circuit 400, 450 may program the PCRAM cell using the selected RESET program condition. For example, a memory controller, such as controller 401 of memory circuit 400, 450, may issue one or more program waveforms according to the selected RESET program condition. As a specific example, the controller 401 of memory circuit 400, 450 may transmit signals to the row decoder 402, column selector 403, and/or read/write driver 404 to cause the row decoder 402, column selector 403, and/or read/write driver 404 to generate one or more instances of the program waveform according to the selected RESET program condition, such as one or more instances of the first waveform generated by the first RESET program condition or one or more instances of the second waveform generated by the second RESET program condition.

Figure 7B:
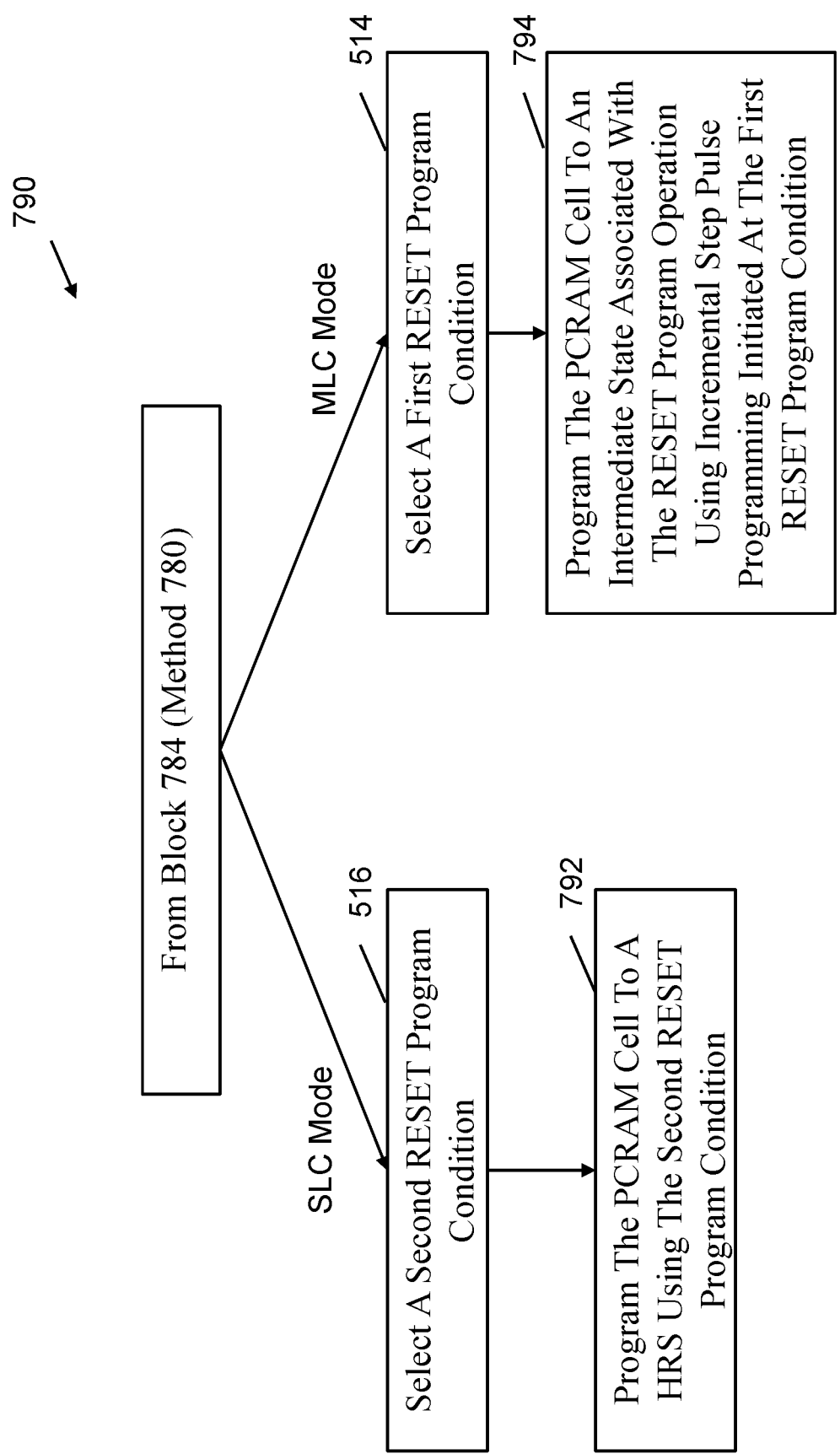
FIG. 7B is a process flow diagram illustrating a method for programming a PCRAM cell, according to various embodiments of the present disclosure.

FIG. 7B is a process flow diagram illustrating a method 790 for programming a PCRAM cell, according to various embodiments of the present disclosure. With reference to FIGS. 1-7B, in various embodiments, the operations of method 790 may be performed by a memory circuit, such as memory circuit 400, 450, including a PCRAM structure, such as PCRAM structure 10. The operations of method 790 may be performed as part of a method for configuring a PCRAM cell, such as a PCRAM cell 100 of a PCRAM structure 10, according to various embodiments of the present disclosure, such as part of the operations of method 780 (FIG. 7A). As a specific example, the operations of method 790 may be performed as part of the operations of blocks 786 and 788 of method 780 (FIG. 7A), such as in response to determining whether the PCRAM cell is in a SLC mode or a MLC mode in block 784.

In response to determining that the PCRAM cell is in a MLC mode, in block 514, the memory circuit 400, 450 may select a second RESET program condition as discussed above with reference to method 510 (FIG. 5B). In response to determining that the PCRAM cell is in a SLC mode, in block 516, the memory circuit 400, 450 may select a second RESET program condition as discussed above with reference to method 510 (FIG. 5B). As discussed with reference to block 786 of method 780 (FIG. 7A), in some embodiments, a RESET program condition, such as the first RESET program condition, having higher current value (e.g., imparting a stronger RESET) may be associated with a MLC mode and a RESET program condition, such as the second RESET program condition, having lower current value (e.g., imparting a weaker RESET) may be associated with SLC mode. As one example, the association may be indicated by the storage location (e.g., a location in I/O buffer 405) of the RESET program conditions, with the first RESET program condition being stored in a location associated with a MLC mode and the second RESET program condition being stored in a location associated with a SLC mode. Based on determining the current mode setting of the PCRAM cell, the corresponding RESET program condition may be selected (e.g., loaded, used, etc.).

In response to selecting the second RESET program condition, the memory circuit 400, 450 may program the PCRAM cell to a HRS using the second RESET program condition in block 792. For example, a memory controller, such as controller 401 of memory circuit 400, 450, may issue one or more program waveforms according to the second RESET program condition. As a specific example, the controller 401 of memory circuit 400, 450 may transmit signals to the row decoder 402, column selector 403, and/or read/write driver 404 to cause the row decoder 402, column selector 403, and/or read/write driver 404 to generate one or more instances of the second waveform generated by the second RESET program condition.

In response to selecting the first RESET program condition, the memory circuit 400, 450 may program the PCRAM cell to an intermediate state associated with the RESET program operation using incremental step pulse programming initiated at the first RESET program condition in block 794. In some embodiments, programming the PCRAM cell to an intermediate state associated with the RESET program operation may include first programming the PCRAM cell to a HRS, such as an HRS using the first RESET program condition, and then programing the PCRAM cell to an intermediate state using incremental step pulse programming. For example, a memory controller, such as controller 401 of memory circuit 400, 450, may issue one or more program waveforms according to the first RESET program condition. In response to using the one or more program waveforms according to the first RESET program condition, the memory controller, such as controller 401 of memory circuit 400, 450, may verify whether the intermedia state was achieved. In response to determining the intermediate state was not achieved, the memory controller, such as controller 401 of memory circuit 400, 450, may issue a series of write and read pulses in a program-verify sequence (or approach) until the intermediate state is determined to be achieved. The series of write pulses may be adjusted (e.g., pulse width and/or current amplitude increased, decreased, etc.) incrementally by the memory controller, such as controller 401 of memory circuit 400, 450, thereby implementing incremental step pulse programming until the intermediate state is determined to be achieved. As a specific example, the controller 401 of memory circuit 400, 450 may transmit signals to the row decoder 402, column selector 403, and/or read/write driver 404 to cause the row decoder 402, column selector 403, and/or read/write driver 404 to generate one or more instances of the first waveform generated by the first RESET program condition. Programming to the HRS using the first RESET program condition may be a strong RESET operation conducive to MCL programing and upon achieving the HRS using the first RESET program condition, the controller 401 of memory circuit 400, 450 may transmit signals to the row decoder 402, column selector 403, and/or read/write driver 404 to cause the row decoder 402, column selector 403, and/or read/write driver 404 to program an intermediate state, such as a first intermediate state (e.g., MCL1) or second intermediate state (e.g., MCL2), using incremental step pulse programming to adjust and reapply, the waveform, until the program-verify sequence (or approach) achieves the intermediate state, such as a first intermediate state (e.g., MCL1) or second intermediate state (e.g., MCL2).

FIG. 8 is a process flow diagram illustrating a method 800 for programming a PCRAM cell, such as a PCRAM cell 100 of a PCRAM structure 10, according to various embodiments of the present disclosure. With reference to FIGS. 1-8, in various embodiments, the operations of method 800 may be performed by a memory circuit, such as memory circuit 400, 450, including a PCRAM structure, such as PCRAM structure 10. The operations of method 800 may be performed in conjunction with operations of any of methods 500, 510, 600, 621, 615, 631, 780, and/or 790.

In block 802, the memory circuit 400, 450 may receive a neural network layer execution indication. For example, the neural network controller 451 may receive neural network layer execution indications, from a host controller or processor. A neural network layer execution indication may be an indication that one or more computations for a next layer of a neural network are to be executed by the circuit 450, such as by one or more PCRAM cell 100 of the circuit 450. The neural network layer execution indication may indicate the type of neural network layer to be executed and/or an error tolerance for the neural network layer. As one example, the neural network controller 451 may receive a neural network layer execution indication indicating a type of a next layer to be executed for a neural network.

In block 804, the memory circuit 400, 450 may determine whether an error tolerance for the neural network layer supports MLC mode operation for a PCRAM cell, such as PCRAM cell 100. For example, the network controller 451 may perform operations to determine an error tolerance associated with the type of the next layer to be executed for the neural network, such as by retrieving the value of an error tolerance from a memory and/or parsing the neural network layer execution indication when the error tolerance is included in the neural network execution indication. As one specific example, the determined error tolerance may be compared to a threshold for error tolerance associated with MLC mode operation, and the determined error tolerance being higher than the threshold for error tolerance associated with MLC mode operation may indicate the error tolerance supports MLC mode. The determined error tolerance being at or below the threshold for error tolerance associated with MLC mode operation may indicate the error tolerance does not support MLC mode.

In response to determining that the error tolerance supports MLC mode, the memory circuit 400, 450 may determine whether the PCRAM cell is in MLC mode in block 806. As an example, the neural network controller 451 may track and/or determine the state of one or more PCRAM cells 100 in the circuit 450, such as whether any PCRAM cell 100 is in a SLC mode and/or a MLC mode. For example, the neural network controller 451 may be configured to perform operations to determine whether a PCRAM cell 100 is in MLC mode or SLC mode in response to determining error tolerance supports MLC mode. In response to determining the PCRAM cell is already in MLC mode, the memory circuit 400, 450 may take no action in block 810. In response to determining the PCRAM cell is in SLC mode, the memory circuit 400, 450 may generate a SLC mode to MLC mode type configuration change command in block 812. In block 816, the memory circuit 400, 450 may send the configuration change command associated with the PCRAM cell. For example, the configuration change command associated with the PCRAM cell may be sent from the neural network controller 451 to the controller 401 and received by the controller 401 as discussed above with reference to block 502.

In response to determining that the error tolerance does not support MLC mode, the memory circuit 400, 450 may determine whether the PCRAM cell is in SLC mode in block 808. As an example, the neural network controller 451 may track and/or determine the state of one or more PCRAM cells 100 in the circuit 450, such as whether any PCRAM cell 100 is in a SLC mode and/or a MLC mode. For example, the neural network controller 451 may be configured to perform operations to determine whether a PCRAM cell 100 is in SLC mode or MLC mode in response to determining error tolerance does not support MLC mode. In response to determining the PCRAM cell is already in SLC mode, the memory circuit 400, 450 may take no action in block 810. In response to determining the PCRAM cell is in MLC mode, the memory circuit 400, 450 may generate a MLC mode to SLC mode type configuration change command in block 814. In block 816, the memory circuit 400, 450 may send the configuration change command associated with the PCRAM cell. For example, the configuration change command associated with the PCRAM cell may be sent from the neural network controller 451 to the controller 401 and received by the controller 401 as discussed above with reference to block 502.

Various embodiments provide methods for configuring a phase-change random-access memory (PCRAM) cell. Various embodiments may achieve tighter MLC resistance distribution in a MLC mode and/or lower program energy consumption in a SLC mode compared to conventional RESET operations.

Various embodiments may provide a method for configuring a phase-change random-access memory (PCRAM) cell (100) including receiving a configuration change command associated with the PCRAM cell (100), determining a type of the received configuration change command, selecting, based at least in part on the determined type of the received configuration change command, a RESET program condition from a plurality of stored RESET program conditions, and programming the PCRAM cell (100) using the selected RESET program condition. In some embodiments, the plurality of stored RESET program conditions includes a first RESET program condition configured to generate a first waveform having a first current amplitude and a first pulse width, and a second RESET program condition configured to generate a second waveform having a second current amplitude and a second pulse width. In some embodiments, the first current amplitude has a higher current value than the second current amplitude. In some embodiments, the first pulse width has a longer time duration than the second pulse width. In some embodiments, determining the type of the received configuration change command may include determining whether the received configuration change command is a single-level-cell (SLC) mode to multi-level-cell (MLC) mode type configuration change command or a MLC mode to SLC mode type configuration change command, and selecting, based at least in part on the determined type of the received configuration change command, the RESET program condition from the plurality of stored RESET program conditions may include selecting the first RESET program condition in response to determining that the received configuration change command is a SLC mode to MLC mode type configuration change command, and selecting the second RESET program condition in response to determining that the received configuration change command is a MLC mode to SLC mode type configuration change command. In some embodiments, the first current amplitude has a higher current value than the second current amplitude and the first pulse width has a longer time duration than the second pulse width. In some embodiments, the method may further include, after programming the PCRAM cell (100) using the selected RESET program condition, determining a RESET program condition operation is to be performed for the PCRAM cell (100), determining whether the PCRAM cell (100) is in a SLC mode or a MLC mode in response to determining the RESET program condition operation is to be performed for the PCRAM cell (100), in response to determining that the PCRAM cell (100) is in the SLC mode, selecting the second RESET program condition, and programming the PCRAM cell (100) to a high resistance state (HRS) using the second RESET program condition, and in response to determining that the PCRAM cell (100) is in the MLC mode, selecting the first RESET program condition, and programming the PCRAM cell (100) to an intermediate state associated with the RESET program condition operation using incremental step pulse programming initiated at the first RESET program condition. In some embodiments, the first current amplitude has a higher current value than the second current amplitude and the first pulse width has a longer time duration than the second pulse width.

Various embodiments may include a memory device (400, 450) including a phase-change random-access memory (PCRAM) cell (100), a current sensing circuit (406), and a controller (401) configured to receive a configuration change command associated with the PCRAM cell (100), determine a type of the received configuration change command, select, based at least in part on the determined type of the received configuration change command, a RESET program condition from a plurality of stored RESET program conditions, and program the PCRAM cell (100) using the selected RESET program condition. In some embodiments, the plurality of stored RESET program conditions includes a first RESET program condition configured to generate a first waveform having a first current amplitude and a first pulse width, and a second RESET program condition configured to generate a second waveform having a second current amplitude and a second pulse width. In some embodiments, the first current amplitude has a higher current value than the second current amplitude. In some embodiments, the first pulse width has a longer time duration than the second pulse width. In some embodiments, the controller (401) may be further configured such that determining the type of the received configuration change command may include determining whether the received configuration change command is a single-level-cell (SLC) mode to multi-level-cell (MLC) mode type configuration change command or a MLC mode to SLC mode type configuration change command, and selecting, based at least in part on the determined type of the received configuration change command, the RESET program condition from the plurality of stored RESET program conditions may include selecting the first RESET program condition in response to determining that the received configuration change command is a SLC mode to MLC mode type configuration change command, and selecting the second RESET program condition in response to determining that the received configuration change command is a MLC mode to SLC mode type configuration change command. In some embodiments, the first current amplitude has a higher current value than the second current amplitude and the first pulse width has a longer time duration than the second pulse width. In some embodiments, the controller (401) may be further configured to, after programming the PCRAM cell (100) using the selected RESET program condition, determine a RESET program condition operation is to be performed for the PCRAM cell (100), determine whether the PCRAM cell (100) is in a SLC mode or a MLC mode in response to determining the RESET program condition operation is to be performed for the PCRAM cell (100), in response to determining that the PCRAM cell (100) is in the SLC mode, select the second RESET program condition, and program the PCRAM cell (100) to a high resistance state (HRS) using the second RESET program condition, and in response to determining that the PCRAM cell (100) is in the MLC mode, select the first RESET program condition, and program the PCRAM cell (100) to an intermediate state associated with the RESET program condition operation using incremental step pulse programming initiated at the first RESET program condition. In some embodiments, the first current amplitude has a higher current value than the second current amplitude and the first pulse width has a longer time duration than the second pulse width.

Various embodiments may provide a method for configuring a phase-change random-access memory (PCRAM) cell (100) including receiving a configuration change command associated with the PCRAM cell (100), determining a type of the received configuration change command, selecting, based at least in part on the determined type of the received configuration change command, a RESET verification condition from a plurality of stored RESET verification conditions (e.g., a RESET verification current condition from a plurality of stored RESET verification current conditions, a RESET verification voltage condition from a plurality of stored RESET verification voltage conditions, etc.), programming the PCRAM cell (100) using a RESET pulse, determining a PCRAM cell (100) condition (e.g., a PCRAM cell (100) current, a PCRAM cell (100) voltage, etc.) in response to programming the PCRAM cell (100) using the RESET pulse, determining whether the determined PCRAM cell (100) condition meets the selected RESET verification condition (e.g., determining whether the determined PCRAM cell (100) current is less than the selected RESET verification current condition, determining whether the determined PCRAM cell (100) voltage is greater than the selected RESET verification voltage condition, etc.), modifying the RESET pulse to increase one or both of its current amplitude and its pulse width in response to determining the PCRAM cell (100) condition does not meet the selected RESET verification condition, and programming the PCRAM cell (100) using the modified RESET pulse. In some embodiments, the plurality of stored RESET verification conditions includes a first RESET verification current condition having a first current value and a second RESET verification current condition having a second current value or the plurality of stored RESET verification conditions includes a first RESET verification voltage condition having a first voltage value and a second RESET verification voltage condition having a second voltage value. In some embodiments determining the type of the received configuration change command includes determining whether the received configuration change command is a single-level-cell (SLC) mode to multi-level-cell (MLC) mode type configuration change command or a MLC mode to SLC mode type configuration change command, and selecting, based at least in part on the determined type of the received configuration change command, the RESET verification condition from the plurality of stored RESET verification conditions includes selecting a first RESET verification condition in response to determining that the received configuration change command is a SLC mode to MLC mode type configuration change command, and selecting a second RESET verification condition in response to determining that the received configuration change command is a MLC mode to SLC mode type configuration change command. In some embodiments a first current value of the first RESET verification condition is a lower current value than a second current value of the second RESET verification condition or a first voltage value of the first RESET verification condition is a higher voltage value than a second voltage value of the second RESET verification condition. In some embodiments, the method further includes, in response to programming the PCRAM cell (100) using the modified RESET pulse and successively until the PCRAM cell (100) condition is determined to meet the selected RESET verification condition, determining the PCRAM cell (100) condition, determining whether the determined PCRAM cell (100) condition meets the selected RESET verification condition, modifying the modified RESET pulse to increase one or both of its current amplitude and its pulse width in response to determining the PCRAM cell (100) current does not meet the selected RESET verification condition, and programming the PCRAM cell (100) using the modified RESET pulse. In some embodiments, the method further includes after determining the PCRAM cell (100) meets the selected RESET verification condition, determining a RESET program operation is to be performed for the PCRAM cell (100), determining whether the PCRAM cell (100) is in a SLC mode or a MLC mode in response to determining the RESET program operation is to be performed for the PCRAM cell (100), in response to determining that the PCRAM cell (100) is in the MLC mode, selecting a first RESET program condition, and programming the PCRAM cell (100) to an intermediate state associated with the RESET program operation using incremental step pulse programming initiated at the first RESET program condition, and in response to determining that the PCRAM cell (100) is in the SLC mode, selecting a second RESET program condition; and programming the PCRAM cell (100) to a high resistance state (HRS) using the second RESET program condition. In some embodiments the first RESET program condition is configured to generate a first waveform having a first current amplitude and a first pulse width, the second RESET program condition is configured to generate a second waveform having a second current amplitude and a second pulse width, and the first current amplitude has a higher current value than the second current amplitude and the first pulse width has a longer time duration than the second pulse width.

Various embodiments may include a memory device (400, 450) including a phase-change random-access memory (PCRAM) cell (100), a current sensing circuit (406) and/or voltage sensing circuit (407), and a controller (401) configured to receive a configuration change command associated with the PCRAM cell (100), determine a type of the received configuration change command, select, based at least in part on the determined type of the received configuration change command, a RESET verification condition from a plurality of stored RESET verification conditions (e.g., a RESET verification current condition from a plurality of stored RESET verification current conditions, a RESET verification voltage condition from a plurality of stored RESET verification voltage conditions, etc.), program the PCRAM cell (100) using a RESET pulse, determine a PCRAM cell (100) condition (e.g., a PCRAM cell (100) current, a PCRAM cell (100) voltage, etc.) in response to programming the PCRAM cell (100) using the RESET pulse, determine whether the determined PCRAM cell (100) condition meets the selected RESET verification condition (e.g., determine whether the determined PCRAM cell (100) current is less than the selected RESET verification current condition, determine whether the determined PCRAM cell (100) voltage is greater than the selected RESET verification voltage condition, etc.), modify the RESET pulse to increase one or both of its current amplitude and its pulse width in response to determining the PCRAM cell (100) condition does not meet the selected RESET verification current condition, and program the PCRAM cell (100) using the modified RESET pulse. In some embodiments, the plurality of stored RESET verification conditions includes a first RESET verification current condition having a first current value and a second RESET verification current condition having a second current value or the plurality of stored RESET verification conditions includes a first RESET verification voltage condition having a first voltage value and a second RESET verification voltage condition having a second voltage value. In some embodiments, the controller (401) may be further configured such that determining the type of the received configuration change command includes determining whether the received configuration change command is a single-level-cell (SLC) mode to multi-level-cell (MLC) mode type configuration change command or a MLC mode to SLC mode type configuration change command, and selecting, based at least in part on the determined type of the received configuration change command, the RESET verification condition from the plurality of stored RESET verification conditions includes selecting a RESET verification condition in response to determining that the received configuration change command is a SLC mode to MLC mode type configuration change command, and selecting a second RESET verification condition in response to determining that the received configuration change command is a MLC mode to SLC mode type configuration change command. In some embodiments a first current value of the first RESET verification condition is a lower current value than a second current value of the second RESET verification condition or a first voltage value of the first RESET verification condition is a higher voltage value than a second voltage value of the second RESET verification condition. In some embodiments, the controller (401) may be further configured to, in response to programming the PCRAM cell (100) using the modified RESET pulse and successively until the PCRAM cell (100) condition is determined to meet the selected RESET verification condition, determine the PCRAM cell (100) condition, determine whether the determined PCRAM cell (100) condition meets the selected RESET verification condition, modify the modified RESET pulse to increase one or both of its current amplitude and its pulse width in response to determining the PCRAM cell (100) condition does not meet the selected RESET verification condition, and program the PCRAM cell (100) using the modified RESET pulse. In some embodiments, the controller (401) may be further configured to, after determining the PCRAM cell (100) condition meets the selected RESET verification condition, determine a RESET program operation is to be performed for the PCRAM cell (100), determine whether the PCRAM cell (100) is in a SLC mode or a MLC mode in response to determining the RESET program operation is to be performed for the PCRAM cell (100), in response to determining that the PCRAM cell (100) is in the MLC mode, select a first RESET program condition, and program the PCRAM cell (100) to an intermediate state associated with the RESET program operation using incremental step pulse programming initiated at the first RESET program condition, and in response to determining that the PCRAM cell (100) is in the SLC mode, select a second RESET program condition; and program the PCRAM cell (100) to a high resistance state (HRS) using the second RESET program condition. In some embodiments the first RESET program condition is configured to generate a first waveform having a first current amplitude and a first pulse width, the second RESET program condition is configured to generate a second waveform having a second current amplitude and a second pulse width, and the first current amplitude has a higher current value than the second current amplitude and the first pulse width has a longer time duration than the second pulse width.

Various embodiments may provide a method for configuring a phase-change random-access memory (PCRAM) cell (100) including determining a RESET program operation is to be performed for the PCRAM cell (100), determining whether the PCRAM cell (100) is in a single-level-cell (SLC) mode or a multi-level-cell (MLC) mode in response to determining the RESET program operation is to be performed for the PCRAM cell (100), selecting a RESET program condition from a plurality of stored RESET program conditions based at least in part on whether the PCRAM cell (100) is in the SLC mode or the MLC mode, and programming the PCRAM cell (100) using the selected RESET program condition. In some embodiments, the plurality of stored RESET program conditions includes a first RESET program condition configured to generate a first waveform having a first current amplitude and a first pulse width, and a second RESET program condition configured to generate a second waveform having a second current amplitude and a second pulse width. In some embodiments, selecting the RESET program condition from the plurality of stored RESET program conditions based at least in part on whether the PCRAM cell (100) is in the SLC mode or the MLC mode includes selecting the second RESET program condition in response to determining that the PCRAM cell (100) is in the SLC mode, and selecting the first RESET program condition in response to determining that the PCRAM cell (100) is in the MLC mode. In some embodiments, programming the PCRAM cell (100) using the selected RESET program condition includes, in response to determining that the PCRAM cell (100) is in the SLC mode, programming the PCRAM cell (100) to a high resistance state (HRS) using the second RESET program condition, and in response to determining that the PCRAM cell (100) is in the MLC mode, programming the PCRAM cell (100) to an intermediate state associated with the RESET program operation using incremental step pulse programming initiated at the first RESET program condition. In some embodiments, the first current amplitude has a higher current value than the second current amplitude and the first pulse width has a longer time duration than the second pulse width.

Various embodiments may include a memory device (400, 450) including a phase-change random-access memory (PCRAM) cell (100), a current sensing circuit (406), and a controller (401) configured to determine a RESET program operation is to be performed for the PCRAM cell (100), determine whether the PCRAM cell (100) is in a single-level-cell (SLC) mode or a multi-level-cell (MLC) mode in response to determining the RESET program operation is to be performed for the PCRAM cell (100), select a RESET program condition from a plurality of stored RESET program conditions based at least in part on whether the PCRAM cell (100) is in the SLC mode or the MLC mode, and program the PCRAM cell (100) using the selected RESET program condition. In some embodiments, the plurality of stored RESET program conditions includes a first RESET program condition configured to generate a first waveform having a first current amplitude and a first pulse width, and a second RESET program condition configured to generate a second waveform having a second current amplitude and a second pulse width. In some embodiments, the controller (401) may be further configured such that selecting the RESET program condition from the plurality of stored RESET program conditions based at least in part on whether the PCRAM cell (100) is in the SLC mode or the MLC mode includes selecting the second RESET program condition in response to determining that the PCRAM cell (100) is in the SLC mode, and selecting the first RESET program condition in response to determining that the PCRAM cell (100) is in the MLC mode. In some embodiments, the controller (401) may be further configured such that programming the PCRAM cell (100) using the selected RESET program condition includes, in response to determining that the PCRAM cell (100) is in the SLC mode, programming the PCRAM cell (100) to a high resistance state (HRS) using the second RESET program condition, and in response to determining that the PCRAM cell (100) is in the MLC mode, programming the PCRAM cell (100) to an intermediate state associated with the RESET program operation using incremental step pulse programming initiated at the first RESET program condition. In some embodiments, the first current amplitude has a higher current value than the second current amplitude and the first pulse width has a longer time duration than the second pulse width.

Various embodiments may provide a method for configuring a phase-change random-access memory (PCRAM) cell (100) including determining a type of a configuration change command associated with the PCRAM cell (100), selecting, based at least in part on the determined type of the configuration change command, a RESET program condition from a plurality of stored RESET program conditions, and programming the PCRAM cell (100) using the selected RESET program condition. In some embodiments, the configuration change command is generated based at least in part on an error tolerance for a neural network layer. In some embodiments, the plurality of stored RESET program conditions includes a first RESET program condition configured to generate a first waveform having a first current amplitude and a first pulse width, and a second RESET program condition configured to generate a second waveform having a second current amplitude and a second pulse width. In some embodiments, the first current amplitude has a higher current value than the second current amplitude. In some embodiments, the first pulse width has a longer time duration than the second pulse width. In some embodiments, determining the type of the configuration change command may include determining whether the configuration change command is a single-level-cell (SLC) mode to multi-level-cell (MLC) mode type configuration change command or a MLC mode to SLC mode type configuration change command, and selecting, based at least in part on the determined type of the configuration change command, the RESET program condition from the plurality of stored RESET program conditions may include selecting the first RESET program condition in response to determining that the configuration change command is a SLC mode to MLC mode type configuration change command, and selecting the second RESET program condition in response to determining that the configuration change command is a MLC mode to SLC mode type configuration change command. In some embodiments, the first current amplitude has a higher current value than the second current amplitude and the first pulse width has a longer time duration than the second pulse width. In some embodiments, the method may further include, after programming the PCRAM cell (100) using the selected RESET program condition, determining a RESET program condition operation is to be performed for the PCRAM cell (100), determining whether the PCRAM cell (100) is in a SLC mode or a MLC mode in response to determining the RESET program condition operation is to be performed for the PCRAM cell (100), in response to determining that the PCRAM cell (100) is in the SLC mode, selecting the second RESET program condition, and programming the PCRAM cell (100) to a high resistance state (HRS) using the second RESET program condition, and in response to determining that the PCRAM cell (100) is in the MLC mode, selecting the first RESET program condition, and programming the PCRAM cell (100) to an intermediate state associated with the RESET program condition operation using incremental step pulse programming initiated at the first RESET program condition. In some embodiments, the first current amplitude has a higher current value than the second current amplitude and the first pulse width has a longer time duration than the second pulse width.

Various embodiments may include a memory device (400, 450) including a phase-change random-access memory (PCRAM) cell (100), a current sensing circuit (406), and a controller (401) configured to determine a type of a configuration change command associated with the PCRAM cell (100), select, based at least in part on the determined type of the configuration change command, a RESET program condition from a plurality of stored RESET program conditions, and program the PCRAM cell (100) using the selected RESET program condition. In some embodiments, the plurality of stored RESET program conditions includes a first RESET program condition configured to generate a first waveform having a first current amplitude and a first pulse width, and a second RESET program condition configured to generate a second waveform having a second current amplitude and a second pulse width. In some embodiments, the first current amplitude has a higher current value than the second current amplitude. In some embodiments, the first pulse width has a longer time duration than the second pulse width. In some embodiments, the controller (401) may be further configured such that determining the type of the configuration change command may include determining whether the configuration change command is a single-level-cell (SLC) mode to multi-level-cell (MLC) mode type configuration change command or a MLC mode to SLC mode type configuration change command, and selecting, based at least in part on the determined type of the configuration change command, the RESET program condition from the plurality of stored RESET program conditions may include selecting the first RESET program condition in response to determining that the configuration change command is a SLC mode to MLC mode type configuration change command, and selecting the second RESET program condition in response to determining that the configuration change command is a MLC mode to SLC mode type configuration change command. In some embodiments, the first current amplitude has a higher current value than the second current amplitude and the first pulse width has a longer time duration than the second pulse width. In some embodiments, the controller (401) may be further configured to, after programming the PCRAM cell (100) using the selected RESET program condition, determine a RESET program condition operation is to be performed for the PCRAM cell (100), determine whether the PCRAM cell (100) is in a SLC mode or a MLC mode in response to determining the RESET program condition operation is to be performed for the PCRAM cell (100), in response to determining that the PCRAM cell (100) is in the SLC mode, select the second RESET program condition, and program the PCRAM cell (100) to a high resistance state (HRS) using the second RESET program condition, and in response to determining that the PCRAM cell (100) is in the MLC mode, select the first RESET program condition, and program the PCRAM cell (100) to an intermediate state associated with the RESET program condition operation using incremental step pulse programming initiated at the first RESET program condition. In some embodiments, the first current amplitude has a higher current value than the second current amplitude and the first pulse width has a longer time duration than the second pulse width.

Various embodiments may provide a method for configuring a phase-change random-access memory (PCRAM) cell (100) including determining whether attribute of a neural network layer supports changing an operating mode of the PCRAM cell (100), and generating a configuration change command to change the operating mode of the PCRAM cell (100) in response to determining that attribute of the neural network layer supports changing the operating mode of the PCRAM cell (100). In some embodiments, the attribute of the neural network layer is an error tolerance for the neural network layer. In some embodiments, the configuration change command is a single-level-cell (SLC) mode to multi-level-cell (MLC) mode type configuration change command. In some embodiments, the configuration change command is a multi-level-cell (MLC) mode to single-level-cell (SLC) mode type configuration change command. Some embodiments may further include receiving the configuration change command associated with the PCRAM cell (100), determining a type of the received configuration change command, selecting, based at least in part on the determined type of the received configuration change command, a RESET program condition from a plurality of stored RESET program conditions, wherein the plurality of stored RESET program conditions comprises at least: a first RESET program condition configured to generate a first waveform having a first current amplitude and a first pulse width; and a second RESET program condition configured to generate a second waveform having a second current amplitude and a second pulse width, and programming the PCRAM cell (100) using the selected RESET program condition. In some embodiments, the plurality of stored RESET program conditions includes a first RESET program condition configured to generate a first waveform having a first current amplitude and a first pulse width, and a second RESET program condition configured to generate a second waveform having a second current amplitude and a second pulse width. In some embodiments, the first current amplitude has a higher current value than the second current amplitude. In some embodiments, the first pulse width has a longer time duration than the second pulse width. In some embodiments, determining the type of the received configuration change command may include determining whether the received configuration change command is a single-level-cell (SLC) mode to multi-level-cell (MLC) mode type configuration change command or a MLC mode to SLC mode type configuration change command, and selecting, based at least in part on the determined type of the received configuration change command, the RESET program condition from the plurality of stored RESET program conditions may include selecting the first RESET program condition in response to determining that the received configuration change command is a SLC mode to MLC mode type configuration change command, and selecting the second RESET program condition in response to determining that the received configuration change command is a MLC mode to SLC mode type configuration change command. In some embodiments, the first current amplitude has a higher current value than the second current amplitude and the first pulse width has a longer time duration than the second pulse width. In some embodiments, the method may further include, after programming the PCRAM cell (100) using the selected RESET program condition, determining a RESET program condition operation is to be performed for the PCRAM cell (100), determining whether the PCRAM cell (100) is in a SLC mode or a MLC mode in response to determining the RESET program condition operation is to be performed for the PCRAM cell (100), in response to determining that the PCRAM cell (100) is in the SLC mode, selecting the second RESET program condition, and programming the PCRAM cell (100) to a high resistance state (HRS) using the second RESET program condition, and in response to determining that the PCRAM cell (100) is in the MLC mode, selecting the first RESET program condition, and programming the PCRAM cell (100) to an intermediate state associated with the RESET program condition operation using incremental step pulse programming initiated at the first RESET program condition. In some embodiments, the first current amplitude has a higher current value than the second current amplitude and the first pulse width has a longer time duration than the second pulse width.

Various embodiments may include a memory device (400, 450) including a phase-change random-access memory (PCRAM) cell (100), a current sensing circuit (406), and a controller (401) configured to determine whether attribute of a neural network layer supports changing an operating mode of the PCRAM cell (100), and generate a configuration change command to change the operating mode of the PCRAM cell (100) in response to determining that attribute of the neural network layer supports changing the operating mode of the PCRAM cell (100). In some embodiments, the attribute of the neural network layer is an error tolerance for the neural network layer. In some embodiments, the configuration change command is a single-level-cell (SLC) mode to multi-level-cell (MLC) mode type configuration change command. In some embodiments, the configuration change command is a multi-level-cell (MLC) mode to single-level-cell (SLC) mode type configuration change command. In some embodiments, the controller (401) may be further configured to receive the configuration change command associated with the PCRAM cell (100), determine a type of the received configuration change command, select, based at least in part on the determined type of the received configuration change command, a RESET program condition from a plurality of stored RESET program conditions, and program the PCRAM cell (100) using the selected RESET program condition. In some embodiments, the plurality of stored RESET program conditions includes a first RESET program condition configured to generate a first waveform having a first current amplitude and a first pulse width, and a second RESET program condition configured to generate a second waveform having a second current amplitude and a second pulse width. In some embodiments, the first current amplitude has a higher current value than the second current amplitude. In some embodiments, the first pulse width has a longer time duration than the second pulse width. In some embodiments, the controller (401) may be further configured such that determining the type of the received configuration change command may include determining whether the received configuration change command is a single-level-cell (SLC) mode to multi-level-cell (MLC) mode type configuration change command or a MLC mode to SLC mode type configuration change command, and selecting, based at least in part on the determined type of the received configuration change command, the RESET program condition from the plurality of stored RESET program conditions may include selecting the first RESET program condition in response to determining that the received configuration change command is a SLC mode to MLC mode type configuration change command, and selecting the second RESET program condition in response to determining that the received configuration change command is a MLC mode to SLC mode type configuration change command. In some embodiments, the first current amplitude has a higher current value than the second current amplitude and the first pulse width has a longer time duration than the second pulse width. In some embodiments, the controller (401) may be further configured to, after programming the PCRAM cell (100) using the selected RESET program condition, determine a RESET program condition operation is to be performed for the PCRAM cell (100), determine whether the PCRAM cell (100) is in a SLC mode or a MLC mode in response to determining the RESET program condition operation is to be performed for the PCRAM cell (100), in response to determining that the PCRAM cell (100) is in the SLC mode, select the second RESET program condition, and program the PCRAM cell (100) to a high resistance state (HRS) using the second RESET program condition, and in response to determining that the PCRAM cell (100) is in the MLC mode, select the first RESET program condition, and program the PCRAM cell (100) to an intermediate state associated with the RESET program condition operation using incremental step pulse programming initiated at the first RESET program condition. In some embodiments, the first current amplitude has a higher current value than the second current amplitude and the first pulse width has a longer time duration than the second pulse width.

The foregoing method descriptions and the process flow diagrams are provided merely as illustrative examples and are not intended to require or imply that the operations of various embodiments must be performed in the order presented. As will be appreciated by one of skill in the art the order of operations in the foregoing embodiments may be performed in any order. Words such as "thereafter," "then," "next," etc. are not intended to limit the order of the operations; these words are used to guide the reader through the description of the methods. Further, any reference to claim elements in the singular, for example, using the articles "a," "an," or "the" is not to be construed as limiting the element to the singular.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for configuring a phase-change random-access memory (PCRAM) cell, comprising:
   receiving a configuration change command associated with the PCRAM cell;
   determining a type of the received configuration change command;
   selecting, based at least in part on the determined type of the received configuration change command, a RESET program condition from a plurality of stored RESET program conditions; and
   programming the PCRAM cell using the selected RESET program condition.

2. The method of claim 1, wherein the plurality of stored RESET program conditions comprises:
   a first RESET program condition configured to generate a first waveform having a first current amplitude and a first pulse width; and
   a second RESET program condition configured to generate a second waveform having a second current amplitude and a second pulse width.

3. The method of claim 2, wherein the first current amplitude has a higher current value than the second current amplitude.

4. The method of claim 2, wherein the first pulse width has a longer time duration than the second pulse width.

5. The method of claim 2, wherein:
   determining the type of the received configuration change command comprises determining whether the received configuration change command is a single-level-cell (SLC) mode to multi-level-cell (MLC) mode type configuration change command or a MLC mode to SLC mode type configuration change command; and
   selecting, based at least in part on the determined type of the received configuration change command, the RESET program condition from the plurality of stored RESET program conditions comprises:
   selecting the first RESET program condition in response to determining that the received configuration change command is a SLC mode to MLC mode type configuration change command; and
   selecting the second RESET program condition in response to determining that the received configuration change command is a MLC mode to SLC mode type configuration change command.

6. The method of claim 5, wherein the first current amplitude has a higher current value than the second current amplitude and the first pulse width has a longer time duration than the second pulse width.

7. The method of claim 5, further comprising, after programming the PCRAM cell using the selected RESET program condition:
   determining a RESET program condition operation is to be performed for the PCRAM cell;
   determining whether the PCRAM cell is in a SLC mode or a MLC mode in response to determining the RESET program condition operation is to be performed for the PCRAM cell;
   in response to determining that the PCRAM cell is in the SLC mode:
   selecting the second RESET program condition; and
   programming the PCRAM cell to a high resistance state (HRS) using the second RESET program condition; and
   in response to determining that the PCRAM cell is in the MLC mode:
   selecting the first RESET program condition; and
   programming the PCRAM cell to an intermediate state associated with the RESET program condition operation using incremental step pulse programming initiated at the first RESET program condition.

8. The method of claim 7, wherein the first current amplitude has a higher current value than the second current amplitude and the first pulse width has a longer time duration than the second pulse width.

9. A method for configuring a phase-change random-access memory (PCRAM) cell, comprising:
   receiving a configuration change command associated with the PCRAM cell;
   determining a type of the received configuration change command;
   selecting, based at least in part on the determined type of the received configuration change command, a RESET verification condition from a plurality of stored RESET verification conditions;
   programming the PCRAM cell using a RESET pulse;
   determining a PCRAM cell condition in response to programming the PCRAM cell using the RESET pulse;

determining whether the determined PCRAM cell condition meets the selected RESET verification condition;
modifying the RESET pulse to increase one or both of its current amplitude and its pulse width in response to determining the determined PCRAM cell condition does not meet the selected RESET verification condition; and
programming the PCRAM cell using the modified RESET pulse.

10. The method of claim 9, wherein the plurality of stored RESET verification conditions comprises:
a first RESET verification current condition having a first current value and a second RESET verification current condition having a second current value; or
a first RESET verification voltage condition having a first voltage value and a second RESET verification voltage condition having a second voltage value.

11. The method of claim 9, wherein:
determining the type of the received configuration change command comprises determining whether the received configuration change command is a single-level-cell (SLC) mode to multi-level-cell (MLC) mode type configuration change command or a MLC mode to SLC mode type configuration change command; and
selecting, based at least in part on the determined type of the received configuration change command, the RESET verification condition from the plurality of stored RESET verification conditions comprises:
selecting a first RESET verification condition in response to determining that the received configuration change command is a SLC mode to MLC mode type configuration change command; and
selecting a second RESET verification condition in response to determining that the received configuration change command is a MLC mode to SLC mode type configuration change command.

12. The method of claim 11, wherein:
a first current value of the first RESET verification condition is a lower current value than a second current value of the second RESET verification condition; or
a first voltage value of the first RESET verification condition is a higher voltage value than a second voltage value of the second RESET verification condition.

13. The method of claim 9, further comprising:
in response to programming the PCRAM cell using the modified RESET pulse and successively until the PCRAM cell condition is determined meet the selected RESET verification condition:
determining the PCRAM cell condition;
determining whether the determined PCRAM cell condition meets the selected RESET verification condition;
modifying the modified RESET pulse to increase one or both of its current amplitude and its pulse width in response to determining the PCRAM cell condition does not meet the selected RESET verification condition; and
programming the PCRAM cell using the modified RESET pulse.

14. The method of claim 9, further comprising, after determining the PCRAM cell condition meets the selected RESET verification condition:
determining a RESET program condition operation is to be performed for the PCRAM cell;
determining whether the PCRAM cell is in a SLC mode or a MLC mode in response to determining the RESET program condition operation is to be performed for the PCRAM cell;
in response to determining that the PCRAM cell is in the MLC mode:
selecting a first RESET program condition; and
programming the PCRAM cell to an intermediate state associated with the RESET program condition operation using incremental step pulse programming initiated at the first RESET program condition; and
in response to determining that the PCRAM cell is in the SLC mode:
selecting a second RESET program condition; and
programming the PCRAM cell to a high resistance state (HRS) using the second RESET program condition.

15. The method of claim 14, wherein:
the first RESET program condition is configured to generate a first waveform having a first current amplitude and a first pulse width;
the second RESET program condition is configured to generate a second waveform having a second current amplitude and a second pulse width; and
the first current amplitude has a higher current value than the second current amplitude and the first pulse width has a longer time duration than the second pulse width.

16. A method for configuring a phase-change random-access memory (PCRAM) cell, comprising:
determining a RESET program condition operation is to be performed for the PCRAM cell;
determining whether the PCRAM cell is in a single-level-cell (SLC) mode or a multi-level-cell (MLC) mode in response to determining the RESET program condition operation is to be performed for the PCRAM cell;
selecting a RESET program condition from a plurality of stored RESET program conditions based at least in part on whether the PCRAM cell is in the SLC mode or the MLC mode; and
programming the PCRAM cell using the selected RESET program condition.

17. The method of claim 16, wherein the plurality of stored RESET program conditions comprises:
a first RESET program condition configured to generate a first waveform having a first current amplitude and a first pulse width; and
a second RESET program condition configured to generate a second waveform having a second current amplitude and a second pulse width.

18. The method of claim 17, wherein:
selecting the RESET program condition from the plurality of stored RESET program conditions based at least in part on whether the PCRAM cell is in the SLC mode or the MLC mode comprises:
selecting the second RESET program condition in response to determining that the PCRAM cell is in the SLC mode; and
selecting the first RESET program condition in response to determining that the PCRAM cell is in the MLC mode.

19. The method of claim 18, wherein programming the PCRAM cell using the selected RESET program condition comprises:
in response to determining that the PCRAM cell is in the SLC mode, programming the PCRAM cell to a high resistance state (HRS) using the second RESET program condition; and in response to determining that the PCRAM cell is in the MLC mode, programming the PCRAM cell to an intermediate state associated with the RESET program condition operation using incremental step pulse programming initiated at the first RESET program condition.

20. The method of claim 19, wherein the first current amplitude has a higher current value than the second current amplitude and the first pulse width has a longer time duration than the second pulse width.

\* \* \* \* \*